United States Patent
Shigihara et al.

(10) Patent No.: US 8,435,868 B2
(45) Date of Patent: May 7, 2013

(54) SEMICONDUCTOR INTEGRATED CIRCUIT DEVICE AND A METHOD FOR MANUFACTURING A SEMICONDUCTOR INTEGRATED CIRCUIT DEVICE

(75) Inventors: Hisao Shigihara, Tokyo (JP); Hiromi Shigihara, Tokyo (JP); Akira Yajima, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 612 days.

(21) Appl. No.: 12/650,537

(22) Filed: Dec. 30, 2009

(65) Prior Publication Data

US 2010/0181650 A1   Jul. 22, 2010

(30) Foreign Application Priority Data

Jan. 20, 2009 (JP) ................... 2009-009914
Oct. 2, 2009 (JP) ................... 2009-230239

(51) Int. Cl.
*H01L 21/302* (2006.01)

(52) U.S. Cl.
USPC .... 438/462; 438/460; 438/463; 257/E21.214; 257/E23.179

(58) Field of Classification Search ........... 438/462, 438/463, 460; 257/E21.214, E23.179
See application file for complete search history.

(56) References Cited

U.S. PATENT DOCUMENTS

| 6,649,445 | B1 | 11/2003 | Qi et al. |
| 6,861,344 | B2 | 3/2005 | Yajima et al. |
| 2004/0164061 | A1 | 8/2004 | Takeuchi et al. |
| 2005/0140006 | A1 | 6/2005 | Takahashi |
| 2007/0257365 | A1* | 11/2007 | Lu et al. ............ 257/737 |
| 2010/0078768 | A1* | 4/2010 | Dydyk et al. ........ 257/620 |

FOREIGN PATENT DOCUMENTS

| JP | 2003-234348 A | 8/2003 |
| JP | 2003-320466 A | 11/2003 |
| JP | 2004-200195 A | 7/2004 |
| JP | 2005-191436 A | 7/2005 |
| JP | 2005-538572 A | 12/2005 |
| JP | 2006-332216 A | 12/2006 |

* cited by examiner

*Primary Examiner* — Minchul Yang
(74) *Attorney, Agent, or Firm* — Miles & Stockbridge P.C.

(57) ABSTRACT

With a general wafer level package process, in order to prevent corrosion of an aluminum type pad electrode in a scribe region in a plating process, the pad electrode is covered with a pad protective resin film at the same layer as an organic type protective film in a product region. However, this makes it impossible to perform the probe test on the pad electrode in the scribe region after rewiring formation. The present invention provides a method for manufacturing a semiconductor integrated circuit device of a wafer level package system. The organic type protective films in the chip regions and the scribe region are mutually combined to form an integral film pattern. In a pelletization step, the surface layer portion including the organic type protective film at the central part of the scribe region is first removed by laser grooving, to form a large-width groove. Then, a dicing processing of the central part in this groove results in separation into the chip regions.

9 Claims, 36 Drawing Sheets

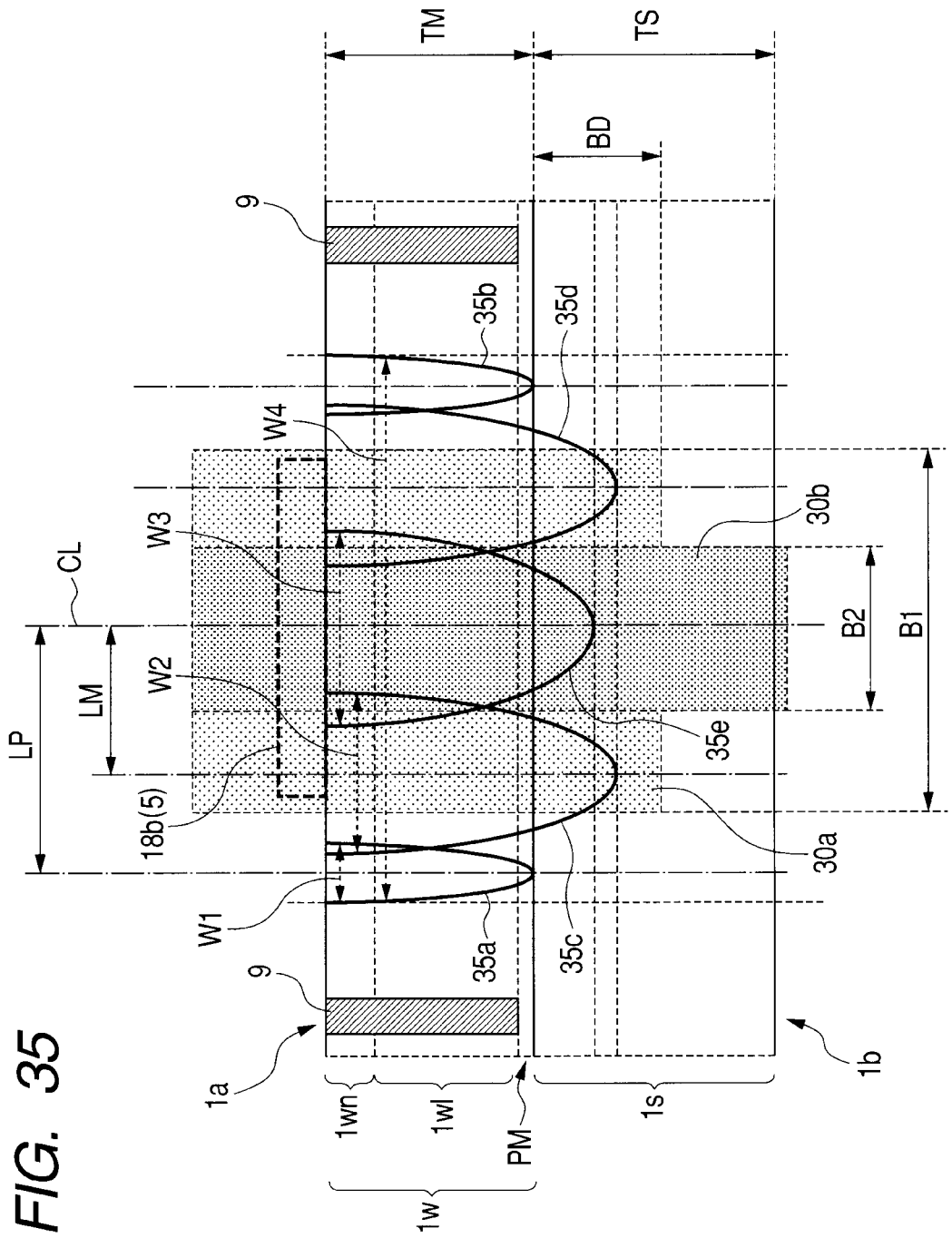

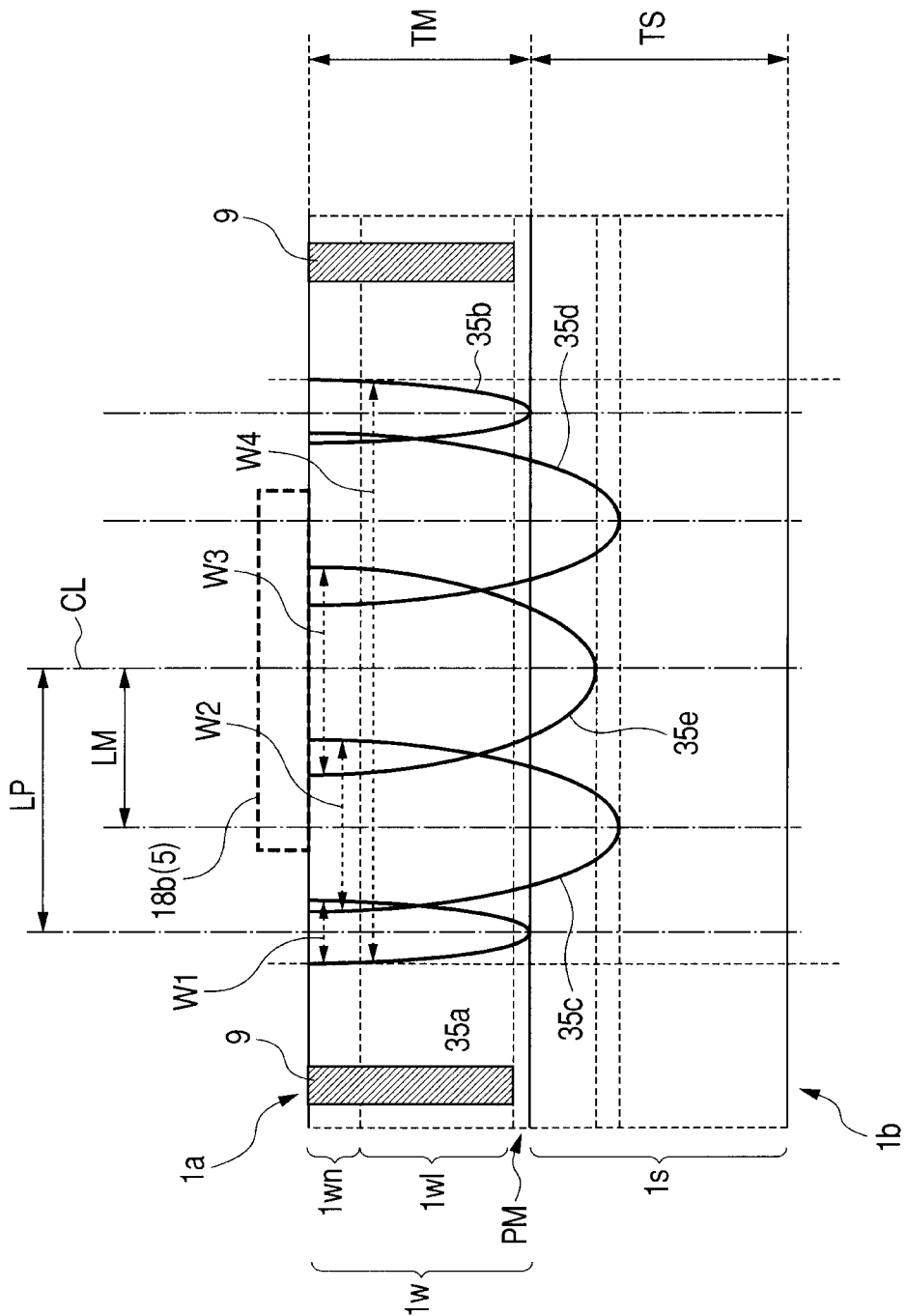

SEMICONDUCTOR INTEGRATED CIRCUIT
DEVICE AND A METHOD FOR
MANUFACTURING A SEMICONDUCTOR
INTEGRATED CIRCUIT DEVICE

CROSS-REFERENCE TO RELATED
APPLICATIONS

The disclosure of Japanese Patent Application No. 2009-9914 filed on Jan. 20, 2009 and Japanese Patent Application No. 2009-230239 filed on Oct. 2, 2009 each including the specification, drawings and abstract are incorporated herein by reference in its entirety.

BACKGROUND OF THE INVENTION

The present invention relates to a technology effectively applicable to a rewiring peripheral structure of a semiconductor integrated circuit device, and a rewiring peripheral processing technology in a method for manufacturing a semiconductor integrated circuit device (or a semiconductor device).

In Japanese Unexamined Patent Publication No. 2004-200195 (Patent Document 1), there is disclosed a technology of performing a coating processing with a polyimide resin or the like, and a dicing processing after formation of bump electrodes in the wafer level package process.

In a published Japanese translation of a PCT patent application No. 2005-538572 (Patent Document 2) or U.S. Pat. No. 6,649,445 (Patent Document 3), there is disclosed a technology in which after the formation of bump electrodes, the wafer is subjected to half dicing, and is coated with an underfill such as polyimide, and finally, is separated into chips in the wafer level package process.

[Patent Document 1]
Japanese Unexamined Patent Publication No. 2004-200195
[Patent Document 2]
Published Japanese translation of a PCT patent application No. 2005-538572
[Patent Document 3]
U.S. Pat. No. 6,649,445

SUMMARY OF THE INVENTION

The present inventors conducted various studies on the wafer level package process in a method for manufacturing a semiconductor integrated circuit device. As a result, they found the following problems. Namely, in a general wafer level package process, in order to prevent the corrosion of aluminum type pad electrodes in a scribe region or the like in a plating process, the pad electrodes are covered with a resin film for pad protection at the same layer as a polyimide final passivation film in a product region. However, with this configuration, the probe test on the pad electrodes in the scribe region cannot be carried out after rewiring formation. Further, when blade dicing is performed, the polyimide final passivation film in the product region and the pad protective resin film are required to be separated from each other. As a result, the width of the scribe region increases. Still further, there is no polyimide final passivation film at the end of the product region, resulting in a reduction of the reliability, or the like.

The present invention has been made in view of the foregoing problems.

It is an object of the present invention to provide a high-reliability semiconductor integrated circuit device or semiconductor integrated circuit device manufacturing process.

The foregoing and other objects and novel features of the present invention will be apparent from the description of this specification and the accompanying drawings.

Summaries of the representative ones of the inventions disclosed in the present application will be described in brief as follows.

Namely, in accordance with the present invention, in a method for manufacturing a semiconductor integrated circuit device (LSI) of a wafer level package system, an organic type final passivation film in the chip regions and an organic type final passivation film in the scribe region are mutually combined to form an integral film pattern. In a pelletization step, the surface layer portion including the organic type final passivation film at the central part of the scribe region is first removed by laser grooving, thereby to form a large-width groove. Then, the central part in this groove is subjected to a dicing processing (including a combined step with back grinding, or the like), resulting in separation into the chip regions.

Effects obtainable by the representative ones of the inventions disclosed in the present application will be described in brief as follows.

Namely, in accordance with the present invention, in a method for manufacturing a semiconductor integrated circuit device (LSI) of a wafer level package system, an organic type final passivation film in the chip regions and an organic type final passivation film in the scribe region are mutually combined to form an integral film pattern. In a pelletization step, the surface layer portion including the organic type final passivation film at the central part of the scribe region is first removed by laser grooving, thereby to form a large-width groove. Then, the central part in this groove is subjected to a dicing processing (including a combined step with back grinding, or the like), resulting in separation into the chip regions. As a result, there occurs an organic type final passivation film integral up to the end of the top surface (device surface) of the chip. This improves the reliability of the device.

BRIEF DESCRIPTION OF THE DRAWINGS

FIG. 35 is a schematic wafer cross sectional view of a scribe region for conceptually illustrating the dicing step in the method for manufacturing a semiconductor integrated circuit device of one embodiment of the present invention; and FIG. 36 is a schematic wafer cross sectional view of the scribe region for conceptually illustrating the wafer dicing step (grooving step) up to before carrying out dicing by a rotary blade in FIG. 35.

DETAILED DESCRIPTION OF THE PREFERRED EMBODIMENTS

[Outline of Embodiments]

Figure 1:
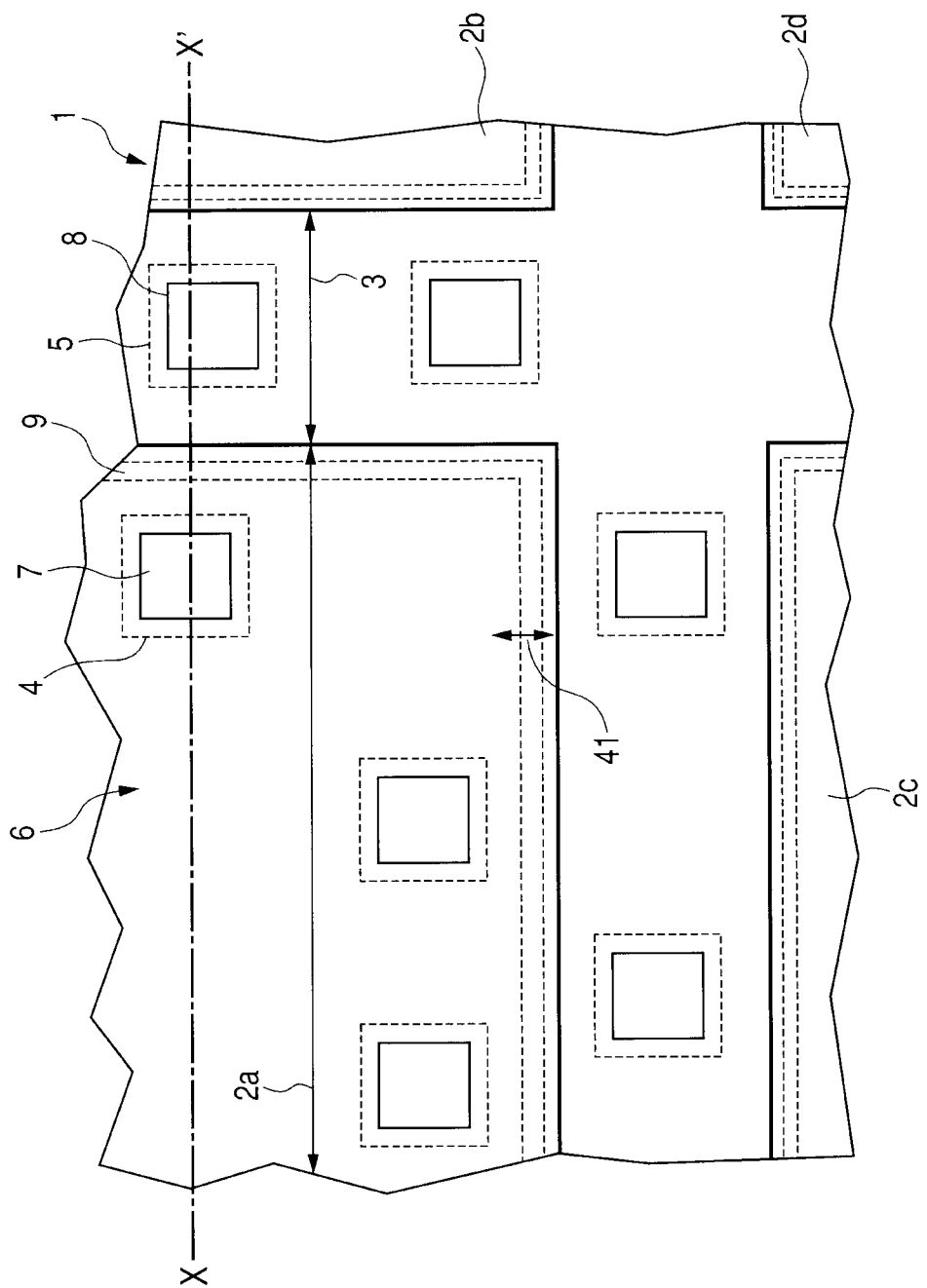
FIG. 1 is a device top view (upon completion of a step of pad opening in an ordinary wiring uppermost part) for illustrating the process flow in a method for manufacturing a semiconductor integrated circuit device of one embodiment of the present invention.

First, the outline of typical embodiments of the present invention disclosed in the present application will be described.

1. A method for manufacturing a semiconductor integrated circuit device, includes the steps of: (a) forming an on-chip rewiring pattern in each chip region over a device surface of a semiconductor wafer having a plurality of chip regions, and a scribe region therebetween, and forming a test rewiring pattern electrically coupled to an aluminum type pad electrode in the scribe region; (b) after the step (a), forming an organic type insulation film almost entirely over the device surface including the surface of the on-chip rewiring pattern; (c) forming a bump forming opening in the organic type insulation film over the on-chip rewiring pattern; (d) forming a bump electrode over the on-chip rewiring pattern at the bump forming opening; (e) after the step (d), carrying out a laser processing on the scribe region, and thereby removing the test rewiring pattern and the aluminum type pad electrode; and (f) carrying out a dicing processing using a rotary blade on the region subjected to the laser processing, and thereby separating the semiconductor wafer into respective chip regions, wherein upon completion of the step (d), the organic type insulation film forms an integral film pattern covering almost the entire region of the chip regions except for the bump forming opening, and almost the entire region of the scribe region.

2. A method for manufacturing a semiconductor integrated circuit device, includes the steps of: (a) forming an on-chip rewiring pattern in each chip region over a device surface of a semiconductor wafer having a plurality of chip regions, and a scribe region therebetween, and forming a test rewiring pattern electrically coupled to an aluminum type pad electrode in the scribe region; (b) after the step (a), forming an organic type insulation film almost entirely over the device surface including the surface of the on-chip rewiring pattern; (c) forming a bump forming opening in the organic type insulation film over the on-chip rewiring pattern; (d) forming a bump electrode over the on-chip rewiring pattern at the bump forming opening; (e) after the step (d), carrying out a laser processing on the scribe region, and thereby removing the organic type insulation film; and (f) carrying out a dicing processing using a rotary blade on the region subjected to the laser processing, and thereby separating the semiconductor wafer into respective chip regions, wherein upon completion of the step (d), the organic type insulation film forms an integral film pattern covering almost the entire region of the chip regions except for the bump forming opening, and almost the entire region of the scribe region.

3. In the method for manufacturing a semiconductor integrated circuit device according to the item 2, in the step (e), the laser processing is carried out, and thereby, further, the test rewiring pattern and the aluminum type pad electrode are removed.

4. A method for manufacturing a semiconductor integrated circuit device, includes the steps of: (a) preparing a semiconductor wafer having a plurality of chip regions, and a scribe region therebetween; (b) after the step (a), carrying out a laser exposure processing including five or more exposure passes on the scribe region; (c) carrying out a dicing processing on the region subjected to the laser exposure processing, and thereby separating the semiconductor wafer into respective chip regions, wherein the step (b) includes the lower steps of: (b1) carrying out a pair of peripheral exposure passes out of the five or more exposure passes; and (b2) after the lower step (b1), carrying out the central exposure pass out of the five or more exposure passes on the central part between the pair of the peripheral exposure passes.

5. In the method for manufacturing a semiconductor integrated circuit device according to the item 4, the dicing processing is carried out using a blade having a smaller blade thickness than the width of the region subjected to the laser exposure processing.

6. In the method for manufacturing a semiconductor integrated circuit device according to the item 4 or 5, the step (c) includes the lower steps of: (c1) forming a cutting groove at almost the central part of the region subjected to the laser exposure processing using a first blade having a smaller blade thickness than the width of the region subjected to the laser exposure processing; and (c2) performing cutting using a second blade with a smaller blade thickness than the width of the region subjected to the laser exposure processing and the blade thickness of the first blade, and thereby separating the semiconductor wafer into respective chip regions.

7. In the method for manufacturing a semiconductor integrated circuit device according to any one of the items 4 to 6, the depth of a groove formed in the lower step (b1) is smaller than the depth of a groove formed in the lower step (b2).

8. In the method for manufacturing a semiconductor integrated circuit device according to any one of the items 4 to 7, the step (b) further includes the lower step of: (b3) after the lower step (b1) and before the lower step (b2), carrying out a pair of intermediate exposure passes between the pair of the peripheral exposure passes and the central exposure pass.

9. The method for manufacturing a semiconductor integrated circuit device according to any one of the items 4 to 8, further includes the steps of: (d) after the step (a) and before the step (b), forming a water-soluble polymer film over the main surface of the semiconductor wafer; and (e) after the step (d) and before the step (c), removing the water-soluble polymer film.

10. In the method for manufacturing a semiconductor integrated circuit device according to any one of the items 4 to 9, the groove formed in the lower step (b2) reaches a semiconductor substrate region of the semiconductor wafer.

11. In the method for manufacturing a semiconductor integrated circuit device according to any one of the items 4 to 10, the pair of the peripheral exposure passes are higher in pulse repetition frequency as compared with the central exposure pass.

12. In the method for manufacturing a semiconductor integrated circuit device according to any one of the items 8 to 11, the pair of the intermediate exposure passes are higher in pulse repetition frequency than the central exposure pass, and are lower than the pair of the peripheral exposure passes.

13. A method for manufacturing a semiconductor integrated circuit device, includes the steps of: (a) preparing a semiconductor wafer having a plurality of chip regions, and a scribe region therebetween; (b) after the step (a), carrying out a laser exposure processing including five or more exposure passes on the scribe region; and (c) carrying out a dicing processing on the region subjected to the laser exposure processing using a blade having a smaller blade thickness than the width of the region subjected to the laser exposure processing, and thereby separating the semiconductor wafer into respective chip regions, wherein the exposure pass of the central part of the five or more exposure passes is higher in exposure intensity than the exposure passes of the peripheral parts.

14. In the method for manufacturing a semiconductor integrated circuit device according to the item 13, the five or more exposure passes include five exposure passes, and the exposure intensity of each of the exposure passes is high at the central part, and is weakened toward the peripheral parts.

Then, the outline of other embodiments of the present invention disclosed in the present application will be described.

1. A method for manufacturing a semiconductor integrated circuit device, includes the steps of: (a) forming an on-chip rewiring pattern in each chip region over a device surface of a semiconductor wafer having a plurality of chip regions, and a scribe region therebetween; (b) after the step (a), forming an organic type insulation film almost entirely over the device surface including the surface of the on-chip rewiring pattern; (c) forming a bump forming opening in the organic type insulation film over the on-chip rewiring pattern; (d) forming a bump electrode over the on-chip rewiring pattern at the bump forming opening; (e) after the step (d), carrying out a laser grooving processing on the scribe region, and thereby forming a groove; and (f) carrying out a dicing processing using a rotary blade on the groove, and thereby separating the semiconductor wafer into respective chip regions, wherein upon completion of the step (d), the organic type insulation film forms an integral film pattern covering almost the entire region of the chip regions except for the bump forming opening, and almost the entire region of the scribe region.

2. In the method for manufacturing a semiconductor integrated circuit device according to the item 1, the dicing processing is carried out by a rotary blade with a smaller blade thickness than the width of the groove.

3. In the method for manufacturing a semiconductor integrated circuit device according to the item 1 or 2, the organic type insulation film is a polyimide type resin film.

4. In the method for manufacturing a semiconductor integrated circuit device according to any one of the items 1 to 3, the bump electrode includes solder as a main constitutional element.

5. In the method for manufacturing a semiconductor integrated circuit device according to any one of the items 1 to 4, the depth of the groove reaches a substrate region of the semiconductor wafer.

6. In the method for manufacturing a semiconductor integrated circuit device according to any one of the items 1 to 5, in the step (a), a test rewiring pattern is formed in the scribe region at the same time.

7. In the method for manufacturing a semiconductor integrated circuit device according to the item 6, in the step (c), a test opening is formed in the organic type insulation film over the test rewiring pattern.

8. In the method for manufacturing a semiconductor integrated circuit device according to the item 7, further includes the step of: (g) between the steps (c) and (d), putting probe needles on the on-chip rewiring pattern and the test rewiring pattern via the bump forming opening and the test opening, respectively, and carrying out a wafer probe test.

9. In the method for manufacturing a semiconductor integrated circuit device according to the item 7, further includes the step of: (h) between the steps (d) and (e), putting probe needles on the bump electrode and the test rewiring pattern, respectively, and carrying out a wafer probe test.

10. In the method for manufacturing a semiconductor integrated circuit device according to any one of the items 1 to 9, the on-chip rewiring pattern is electrically coupled to a common wiring layer via a first aluminum type pad electrode.

11. In the method for manufacturing a semiconductor integrated circuit device according to any one of the items 6 to 10, the test rewiring pattern is electrically coupled to a second aluminum type pad electrode.

12. The method for manufacturing a semiconductor integrated circuit device according to any one of the items 1 to 11, further includes the step of: (i) between the steps (c) and (d), carrying out back grinding.

13. The method for manufacturing a semiconductor integrated circuit device according to any one of the items 1 to 12, further includes the step of: (i) between the steps (d) and (e), carrying out back grinding.

14. The method for manufacturing a semiconductor integrated circuit device according to any one of the items 1 to 13, further includes the step of: (j) between the steps (c) and (d), forming a metal film containing gold as a main component by electroless plating over the top surface of the on-chip rewiring pattern at the bump forming opening portion.

15. In the method for manufacturing a semiconductor integrated circuit device according to the item 14, a metal film containing gold as a main component is formed by electroless plating over the top surface of the test rewiring pattern at the test opening portion.

16. The method for manufacturing a semiconductor integrated circuit device according to the item 8, further includes the step of: (k) between the steps (c) and (g), forming a metal film containing gold as a main component by electroless plating over the top surface of the on-chip rewiring pattern at the bump forming opening portion.

17. The method for manufacturing a semiconductor integrated circuit device according to any one of the items 1 to 16, further includes the lower steps of: (f1) carrying out a half cut dicing processing on the groove; and (f2) after the step (f1), carrying out back grinding, and thereby separating the semiconductor wafer into respective chip regions.

18. A semiconductor integrated circuit device, includes: (a) a semiconductor substrate having a device surface and a back surface; (b) a seal ring disposed over the device surface, and in such a manner as to surround the vicinity of the end thereof; (c) an on-chip rewiring pattern disposed over the device surface and on the inner side of the seal ring; (d) an organic type insulation film covering almost entirely the device surface including the seal ring and the on-chip rewiring pattern across the seal ring up to the end of the device surface in such a manner as to form an integral film pattern; (e) a bump forming opening disposed in the organic type insulation film over the on-chip rewiring pattern; (f) a bump electrode disposed over the on-chip rewiring pattern at the bump forming opening; and (g) a projection disposed at the lower part of the circumferential side surface of the semiconductor substrate in such a manner as to surround the seal ring.

19. In the semiconductor integrated circuit device according to the item 18, the organic type insulation film is a polyimide type resin film.

20. In the semiconductor integrated circuit device according to the item 18 or 19, the bump electrode includes solder as a main constitutional element.

Then, the outline of still other embodiments of the present invention disclosed in the present application will be described.

1. A method for manufacturing a semiconductor integrated circuit device, includes the steps of: (a) forming an on-chip rewiring pattern in each chip region over a device surface of a semiconductor wafer having a plurality of chip regions, and a scribe region therebetween, and forming a test rewiring pattern in the scribe region; (b) after the step (a), forming an organic type insulation film almost entirely over the device surface including the surface of the on-chip rewiring pattern; (c) forming a bump forming opening in the organic type insulation film over the on-chip rewiring pattern; (d) forming a bump electrode over the on-chip rewiring pattern at the bump forming opening; (e) after the step (d), carrying out a laser processing on the scribe region, and thereby removing the test rewiring pattern; and (f) carrying out a dicing processing using a rotary blade on the region subjected to the laser processing, and thereby separating the semiconductor wafer into respective chip regions, wherein upon completion of the step (d), the organic type insulation film forms an integral film pattern covering almost the entire region of the chip regions except for the bump forming opening, and almost the entire region of the scribe region.

2. In the method for manufacturing a semiconductor integrated circuit device according to the item 1, the organic type insulation film is a polyimide type resin film.

3. In the method for manufacturing a semiconductor integrated circuit device according to the item 1 or 2, the bump electrode includes solder as a main constitutional element.

4. In the method for manufacturing a semiconductor integrated circuit device according to any one of the items 1 to 3, in the step (c), a test opening is formed in the organic type insulation film over the test rewiring pattern at the same time.

5. The method for manufacturing a semiconductor integrated circuit device according to the item 4, further includes the step of: (g) between the steps (c) and (d), putting probe needles on the on-chip rewiring pattern and the test rewiring pattern via the bump forming opening and the test opening, respectively, and carrying out a wafer probe test.

6. The method for manufacturing a semiconductor integrated circuit device according to the item 4, further includes the step of: (h) between the steps (d) and (e), putting probe needles on the bump electrode and the test rewiring pattern, respectively, and carrying out a wafer probe test.

7. A method for manufacturing a semiconductor integrated circuit device, includes the steps of: (a) forming an on-chip rewiring pattern in each chip region over a device surface of a semiconductor wafer having a plurality of chip regions, and a scribe region therebetween; (b) after the step (a), forming an organic type insulation film almost entirely over the device surface including the surface of the on-chip rewiring pattern; (c) forming a bump forming opening in the organic type insulation film over the on-chip rewiring pattern; (d) forming a bump electrode over the on-chip rewiring pattern at the bump forming opening; (e) after the step (d), carrying out a laser processing on the scribe region, and thereby removing the organic type insulation film; and (f) carrying out a dicing processing using a rotary blade on the region subjected to the laser processing, and thereby separating the semiconductor wafer into respective chip regions, wherein upon completion of the step (d), the organic type insulation film forms an integral film pattern covering almost the entire region of the chip regions except for the bump forming opening, and almost the entire region of the scribe region.

8. In the method for manufacturing a semiconductor integrated circuit device according to the item 7, the organic type insulation film is a polyimide type resin film.

9. In the method for manufacturing a semiconductor integrated circuit device according to the item 7 or 8, the bump electrode includes solder as a main constitutional element.

10. In the method for manufacturing a semiconductor integrated circuit device according to any one of the items 7 to 9, in the step (a), a test rewiring pattern is formed in the scribe region at the same time.

11. In the method for manufacturing a semiconductor integrated circuit device according to any one of the items 7 to 10, in the step (c), a test opening is formed in the organic type insulation film over the test rewiring pattern at the same time.

12. In the method for manufacturing a semiconductor integrated circuit device according to the item 11, further includes the step of: (g) between the steps (c) and (d), putting probe needles on the on-chip rewiring pattern and the test rewiring pattern via the bump forming opening and the test opening, respectively, and carrying out a wafer probe test.

13. In the method for manufacturing a semiconductor integrated circuit device according to the item 11, further includes the step of: (h) between the steps (d) and (e), putting probe needles on the bump electrode and the test rewiring pattern, respectively, and carrying out a wafer probe test.

[Explanation of Description Form, Basic Terms, and Methods in the Present Application]

1. In the present application, in the following description of embodiments, the description may be divided into a plurality of sections for convenience, if required. However, unless otherwise specified, these sections are not independent of each other, but, are respective parts of a single example, in a relation such that one is a detailed explanation of a part of the other, a modification example of a part or the whole, or the like of the other. Further, in principle, the repetitive description of the same parts will be omitted. Whereas, respective constitutional elements in embodiments are not essential, unless otherwise specified, or except for the case where the number is theoretically limiting, and unless otherwise apparent from the context.

Further, in the present application, the term "semiconductor device" or "semiconductor integrated circuit device" herein used means mainly various transistor (active element) units, and around them as the main part, resistances, capacitors, and the like integrated over a semiconductor chip or the like (e.g., single crystal silicon substrate). Herein, typical examples of various transistors may include MISFET's (Metal Insulator Semiconductor Field Effect Transistor) typified by MOSFET (Metal Oxide Semiconductor Field Effect Transistors). In this case, typical examples of the integrated circuit configuration may include a CMIS (Complementary Metal Insulator Semiconductor) type integrated circuit typified by a CMOS (Complementary Metal Oxide Semiconductor) type integrated circuit including an N channel type MISFET and a P channel type MISFET in combination.

The wafer steps of current-day semiconductor integrated circuit devices, namely, LSI (Large Scale Integration) can be generally largely classified into FEOL (Front End of Line) steps of from transfer in of a silicon wafer as a raw material roughly up to a premetal step (step including formation of an interlayer insulation film or the like between the M1 wiring layer bottom end and the gate electrode structure, formation of contact holes, tungsten plug embedding, and the like), and BEOL (Back End of Line) steps starting from a M1 wiring layer formation roughly up to formation of pad openings into a final passivation film over aluminum type pad electrodes (the process being also included in a wafer level package process). Out of the FEOL steps, a gate electrode patterning step, a contact hole formation step, and the like are microprocessing steps in which particularly microscopic processing is required. On the other hand, in the BEOL steps, in the via and trench formation steps, particularly, in relatively lower layer local wires (e.g., buried micro wires of from M1 to roughly M3 in about four-layer structured buried wires, and of from M1 to roughly M5 in about ten-layer structured buried wires), or the like, microprocessing is particularly required. Incidentally, the term "MN (generally from N=1 to about 15) denotes the Nth layer wire from bottom. M1 is a first-layer wire, and M3 is a third-layer wire.

2. Similarly, in the description of embodiments, and the like, the term "X including A" or the like for the material, composition, or the like does not exclude the one including an element other than A as one of main constitutional elements unless otherwise specified and unless otherwise apparent from the context. For example, for the component, the term is used to embrace "X including A as a main component", and the like.

Specifically, the terms "gold", "nickel", "copper", "chromium", "aluminum", and the like herein used each mean a "member containing each substance as a main component" unless otherwise specified, unless otherwise apparent theoretically, or except for other cases. Further, for example, the terms "aluminum pad" and "aluminum type pad" herein used denote that the whole pad structure is not formed of a member containing aluminum as a main component, but the structural elements of a member containing aluminum as a main component make up the main part of the pad structure. This also holds true for aluminum type wiring, silver type wiring, and the like.

Further, for example, it is naturally understood that the term "silicon member" or the like herein used is not limited to pure silicon but also embraces a SiGe alloy, other multinary alloys containing silicon as a main component, and other members containing additives, and the like. Similarly, it is naturally understood that the term "silicon oxide film", "silicon oxide type insulation film", or the like is intended to embrace not only relatively pure undoped silicon dioxide films, but also thermal oxide films and CVD oxide films of, USG (undoped silicon glass), FSG (fluorosilicate glass), TEOS-based silicon oxide, SiOC (silicon oxicarbide) or carbon-doped silicon oxide or OSG (organosilicate glass), PSG (phosphorus silicate glass), BPSG (borophosphosilicate glass), and the like, coating type silicon oxide films of SOG (spin on glass), NSC (nano-clustering silica: NCS), and the like, silica type low-k insulation films (porous type insulation films) obtained by introducing voids into the same members as these, composite films thereof with other silicon type insulation films containing these as main constituent elements, and the like.

Whereas, silicon type insulation films commonly used in the semiconductor field comparably to silicon oxide type insulation films include silicon nitride type insulation films. The materials belonging to this kind include SiN, SiCN, SiNH, SiCNH, and the like. The term "silicon nitride" herein used embraces both SiN and SiNH unless otherwise specified. Similarly, the term "SiCN" herein used embraces both SiCN and SiCNH.

Incidentally, SiC has properties similar to those of SiN. However, SiON should rather often be classified into a silicon oxide type insulation film.

The silicon nitride film is often used as an etch stop film in the SAC (self-aligned contact) technology, and, in addition, is also used as a stress applying film in the SMT (stress memorization technique).

3. Similarly, as for the drawings, positions, attributes, and the like, preferable examples thereof will be exemplified. However, it is naturally understood that the present invention is not strictly limited thereto, unless otherwise specified, and unless otherwise apparent from the context.

4. Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical value.

5. The term "wafer" herein used generally denotes a single crystal silicon wafer, on which a semiconductor integrated circuit device (as well as a semiconductor device or an electronic device) is formed. However, it is naturally understood that the term also embraces an epitaxial wafer, a SOI substrate, a composite wafer of an insulation substrate such as a LCD glass substrate and a semiconductor layer or the like, or other wafers.

6. the terms "rewiring pattern" or "rewiring layer" herein used does not embrace an underlayer seed metal film in principle. Further, the underlayer seed metal film includes a lower layer diffusion barrier metal film, an uppermost layer seed copper film, and the like.

7. The term "seal ring" which is also referred to as a "scribe guard ring", is, as apparent from the following description, not limited to an annular shape, but assumes a shape along the peripheral end in the form of a rectangle which is a general chip shape.

[Details of Embodiments]

Embodiments will be further described in details. In respective drawings, the same or similar parts are indicated with the same or similar signs or reference numerals, and a description thereon will not be repeated in principle.

Further, in the accompanying drawings, hatching or the like may be omitted even in cross section when it rather complicates the drawing, or when it is apparently distinct from the gap. In conjunction with this, when apparent from the description or the like, even for a two-dimensionally closed hole, the background outline may be omitted. Further, even not in cross section, hatching may be added in order to clearly demonstrate that the part is not a gap.

1. Explanation of wafer process flow in a method for manufacturing a semiconductor integrated circuit device of one embodiment of the present invention (mainly FIGS. 1 to 14)

Figure 2:
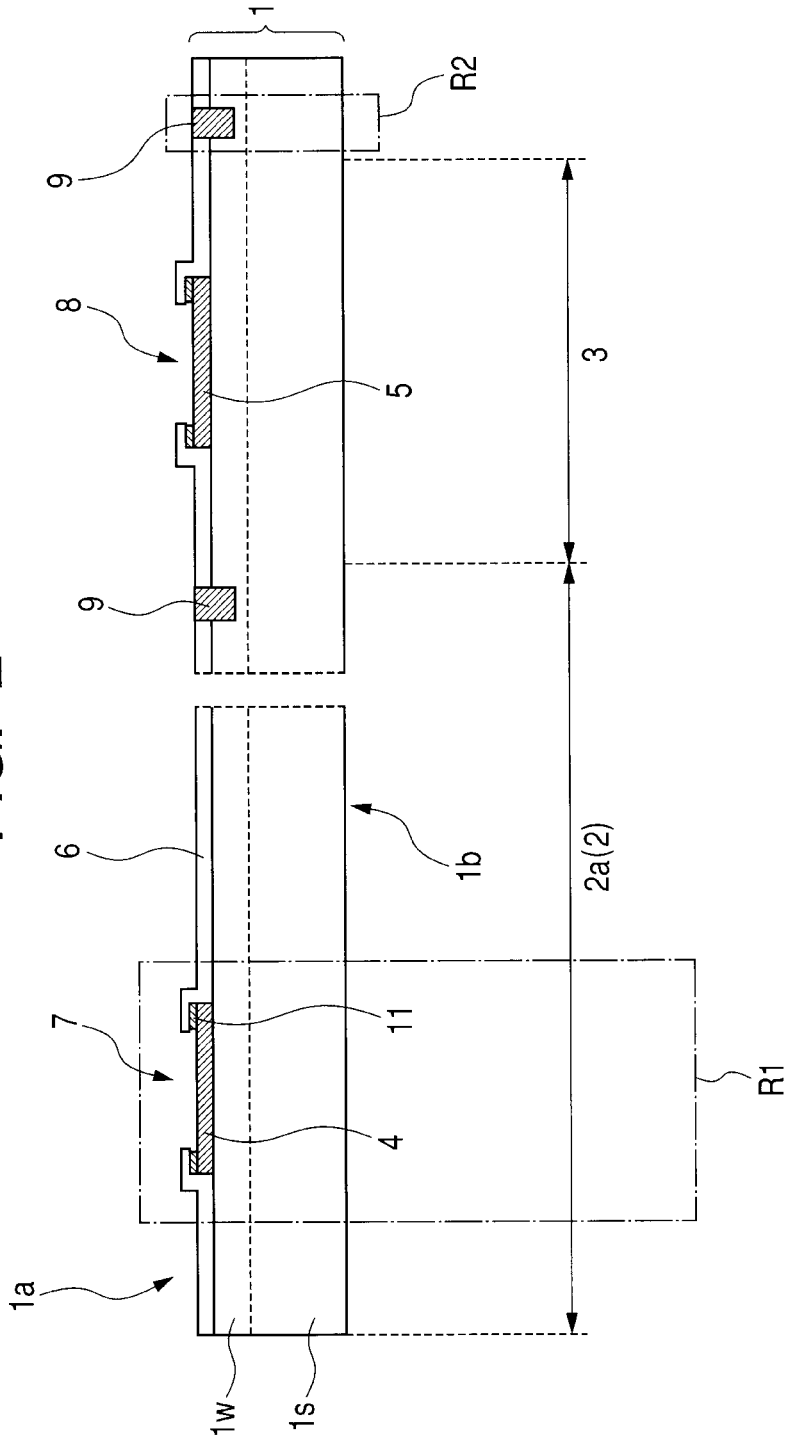
FIG. 2 is a device cross sectional view (upon completion of a step of pad opening in an ordinary wiring uppermost part) corresponding to a cross section along X-X' of FIG. 1.

As shown in FIG. 1 and FIG. 2 which is a cross section along X-X' thereof (a chip region 2a and a scribe region 3, incidentally, chip regions 2b, 2c, and 2d are adjacent chip regions), over the uppermost layer interlayer insulation film on the device surface 1a (main surface opposing a back surface 1b) side, aluminum type pads 4 and 5 (the uppermost layer pad electrode 4 of ordinary wiring in the chip region, and the uppermost layer pad electrode 5 of ordinary wiring in the scribe region) are formed. On the device surface 1a side of a multilayer wiring layer 1w under the bonding pads 4 and 5 (the essential substrate portion 1s is generally, for example, a 300-dia p type single crystal silicon wafer), an inorganic type final passivation film 6 is formed. The aluminum type pad layers 4 and 5 forming the boding pads and the like are exclusively for pads in this example, but may also serve as the uppermost layer wiring layer. The bonding pad 4 or 5 and the inorganic type final passivation film 6 are formed in the following manner. First, over the multilayer wiring layer 1w, by sputtering, there is disposed an aluminum type metal film (generally having, on and under an intermediate main wiring metal layer having a thickness of about 1000 nm, and containing aluminum as a main component, and copper and the like added therein in an amount of about several percent, thin films such as a titanium film with a thickness of about 10 nm, and a titanium nitride film with a thickness of about 50 to 75 nm, and the like; the titanium film and the titanium nitride film form a pad underlayer metal layer). By general lithography, the aluminum type metal film is patterned, so that the bonding pads 4 and 5 are formed. Then, over almost the entire surface on the device surface 1a side of the semiconductor wafer 1, for example, a silicon oxide type insulation film (e.g., with a thickness of about 200 nm) serving as the lower layer inorganic final passivation film is deposited with a plasma CVD process. Subsequently, thereover, for example, a silicon nitride type insulation film (e.g., with a thickness of about 600 nm) serving as the upper layer inorganic final passivation film is deposited with a plasma CVD process. Then, in the inorganic final passivation film 6 including the two layers, by general lithography, pad openings 7 and 8 (an opening 7 of the inorganic type passivation film in the chip region, and an opening 8 of the inorganic type passivation film in the scribe region) are formed. Thereafter, generally, a titanium nitride film 11 over the main wiring metal layer, and the like are removed by dry etching in a self-aligned manner in a mixed gas atmosphere of, for example, argon and chlorine. This results in the cross sectional configuration as shown in FIG. 2. The seal ring 9 is a metal lamination wall for preventing propagation or penetration of damage, contamination, and the like from the chip end. The metal layers forming general multilayer wires (copper damascene wires or aluminum type wires) including the pad layer are stacked to be disposed in such a manner as to surround the vicinity of the chip end 41 (in an annular or closed loop circle around the chip end).

Figure 3:
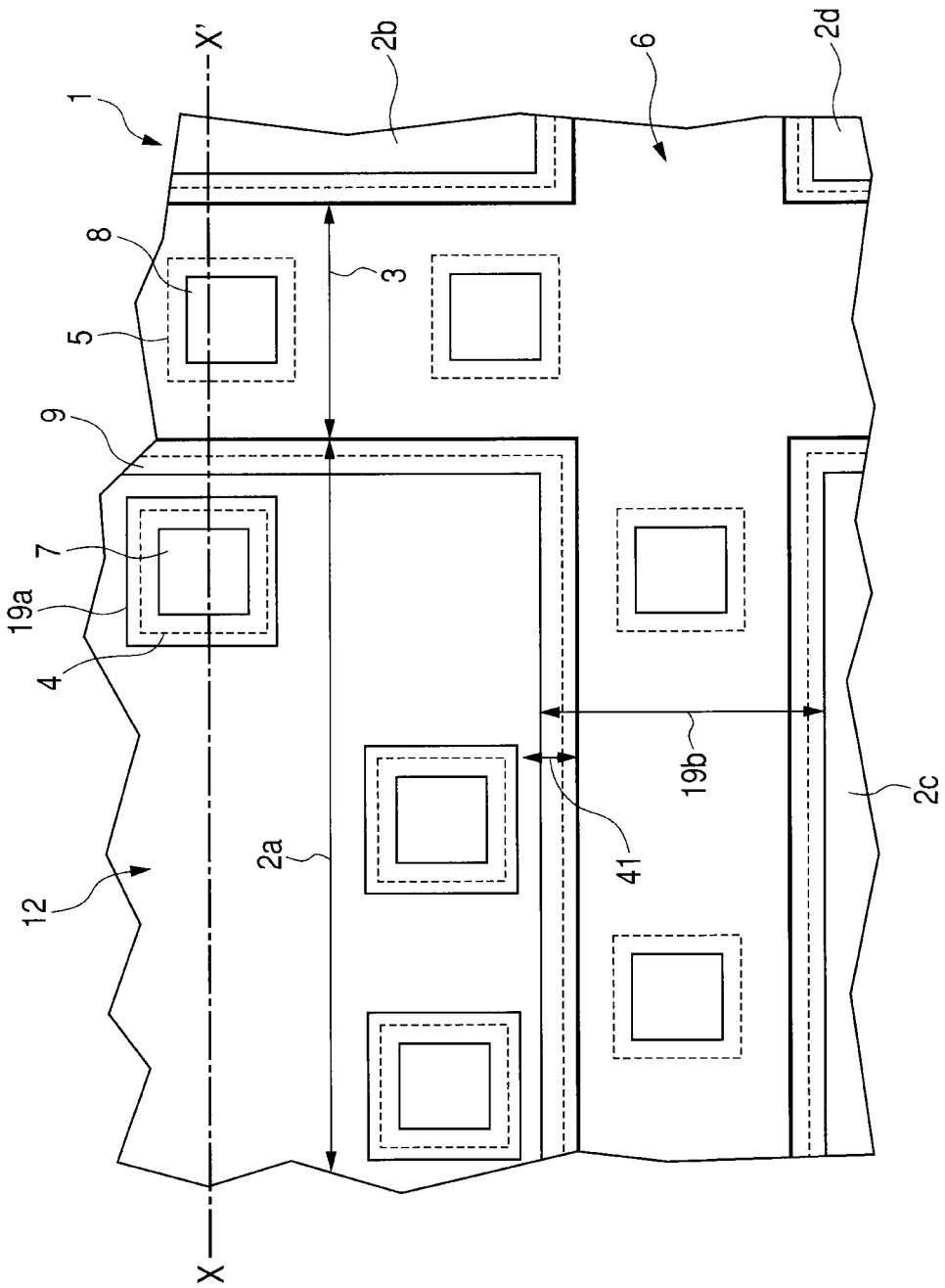
FIG. 3 is a device top view (upon completion of a step of patterning of a lower layer organic type passivation film over a pad electrode) for illustrating the process flow in the method for manufacturing a semiconductor integrated circuit device of one embodiment of the present invention.
Figure 4:
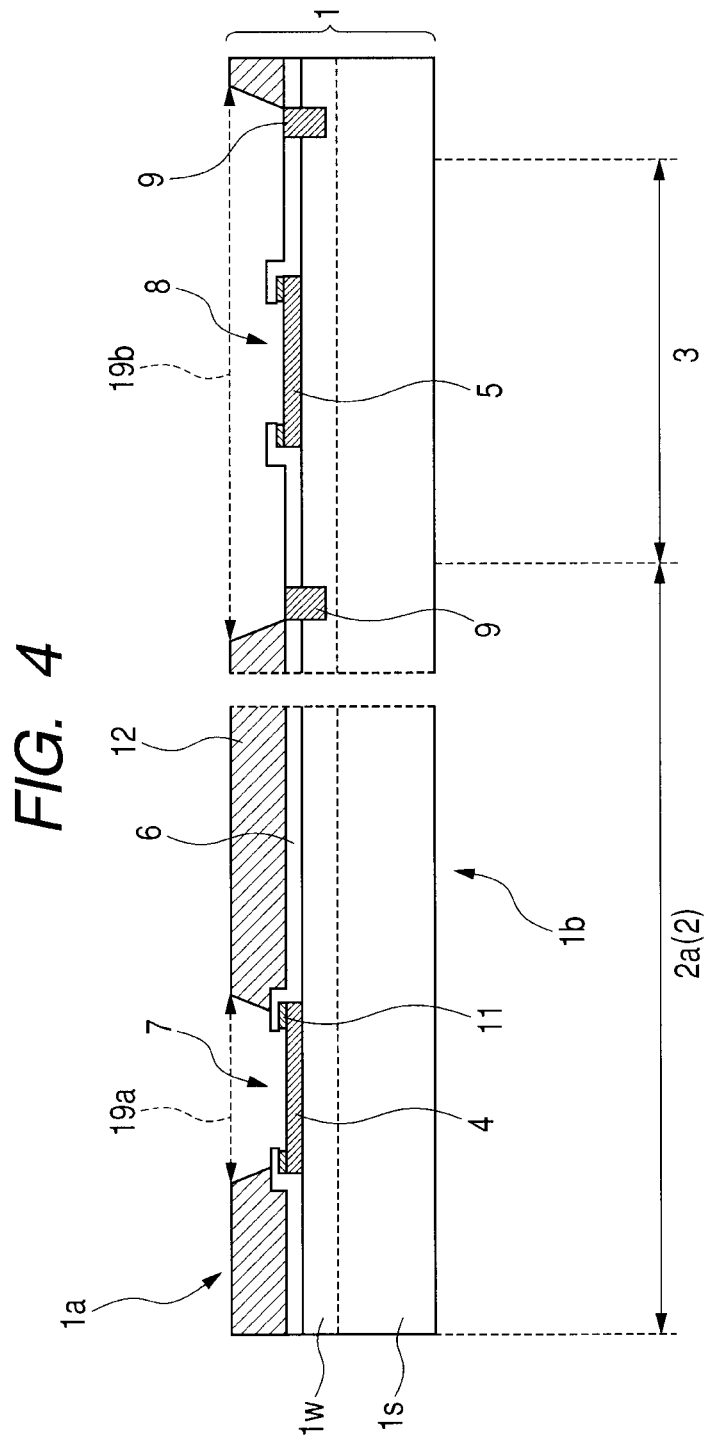
FIG. 4 is a device cross sectional view (upon completion of a step of patterning of a lower layer organic type passivation film over a pad electrode) corresponding to a cross section along X-X' of FIG. 3.

Then, as shown in FIGS. 3 and 4, over almost the entire surface on the device surface 1a side of the semiconductor wafer 1, for example, a photosensitive polyimide film (e.g., with a thickness of about 5 micrometers) serving as the lower layer organic final passivation film 12 is coated. Resin films of, other than polyimide type, BCB (Benzocyclobutene) or other heat resistant polymer type are also acceptable. Subsequently, at almost the same opening positions as those described previously, patterning (formation of an opening 19a corresponding to the opening 7 of the inorganic type passivation film in the chip region and an opening 19b extending through the entire region of the scribe region 3 to the end 41 of the chip region 2) is performed again by general lithography. Subsequently, on the device surface 1a side of the semiconductor wafer 1, an asher processing (oxygen plasma processing) and argon sputtering/etching are successively performed. As a result, the organic matters and the natural oxide film over the surfaces of the pads 4 and 5 are removed.

Figure 5:
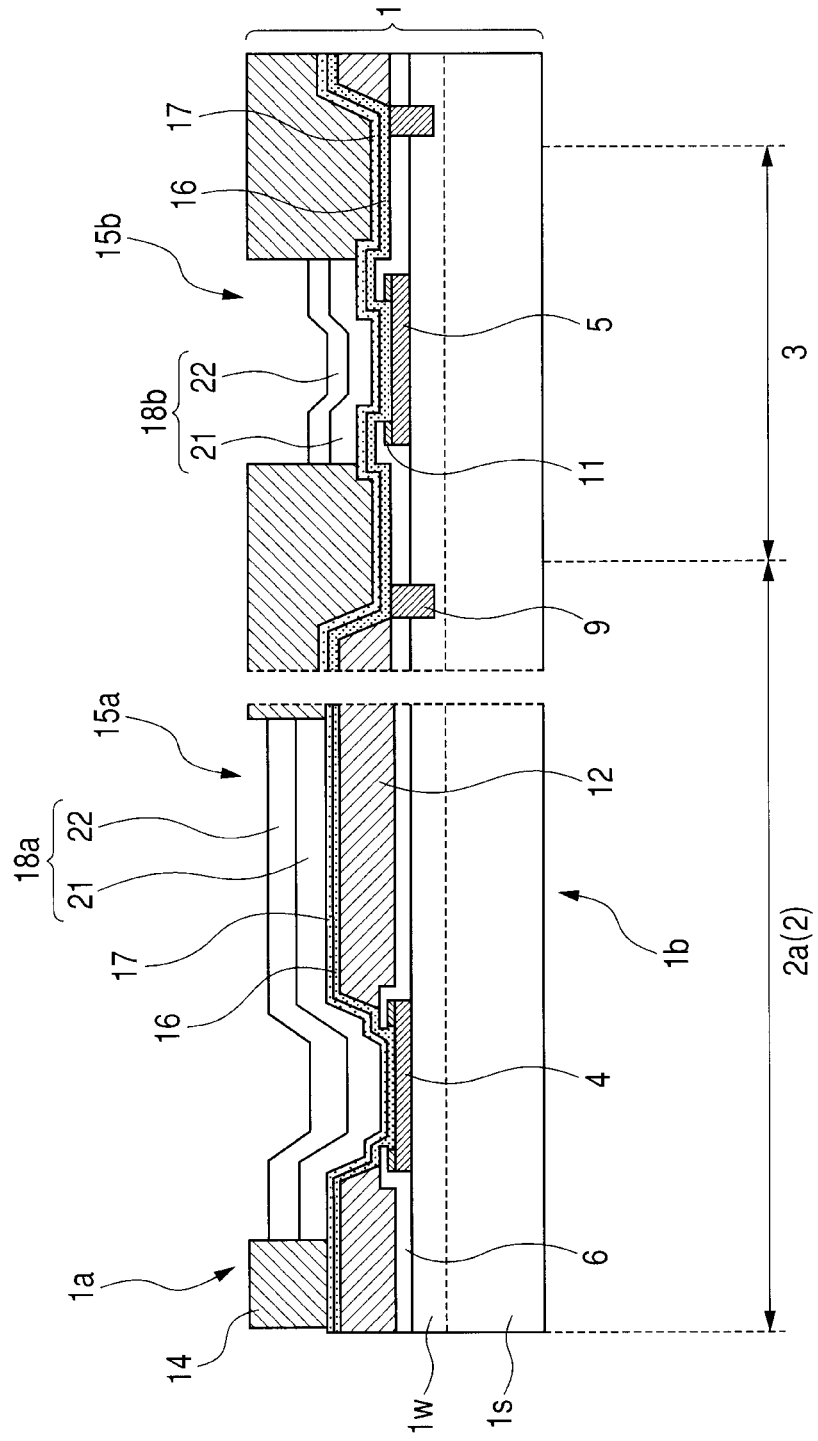
FIG. 5 is a device cross sectional view (upon completion of a step of electroplating of rewiring) corresponding to a cross section along X-X' of FIG. 3.

Then, as shown in FIG. 5, over almost the entire surface of the device surface 1a side of the semiconductor wafer 1, a diffusion barrier metal film 16 (against copper) is deposited by sputtering. Examples of the diffusion barrier metal film 16 may include a metal film (copper diffusion barrier) containing chromium as a main component, and having a thickness of, for example, about 175 nm. Incidentally, examples of the alternative barrier metal material may include, other than those containing chromium as a main component exemplified, those containing one of titanium, titanium nitride, tantalum, tungsten, molybdenum, and the like, or a plurality of materials selected from these as main components.

Then, over the diffusion barrier metal film 16, a copper seed film 17 is deposited by sputtering. Examples of the copper seed film 17 may include a metal film containing copper as a main component, and having a thickness of about 150 nm. Incidentally, examples of the alternative material may include those containing palladium as a main component. The diffusion barrier metal film 16, the copper seed film 17, and the like form an underlayer seed metal film.

Then, over almost the entire surface on the device surface 1a side of the semiconductor wafer 1, a resist film 14 is coated. This is patterned by general lithography, thereby to form resist film openings 15a and 15b in the resist film 14. This results in a resist film pattern 14. Examples of the resist film 14 may include a novolak type positive type photoresist with a thickness of about 15 micrometers.

Then, in the resist film openings 15a and 15b, the lower layer rewiring film 21 is formed by electroplating. Examples of the lower layer rewiring film 21 may include a metal film containing copper as a main component, and having a thickness of about 5 micrometers. Examples of the plating solution may include a copper sulfate solution.

Then, in the resist film openings 15a and 15b, the upper layer rewiring film 22 is formed by electroplating. Examples of the upper layer rewiring film 22 may include a metal film containing nickel as a main component, and having a thickness of about 3 micrometers. Examples of the plating solution may include sulfamate bath and watt bath. The copper plating film 21, the nickel plating film 22, and the like form an on-chip rewiring pattern 18a (with an opening diameter of, for example, about 100 micrometers to 300 micrometers), and a test rewiring pattern 18b (electrically coupled with the second aluminum type pad electrodes, the second aluminum type pad electrodes being electrically coupled with a TEG pattern and the like, the opening diameter being, for example, about 40 micrometers).

Figure 6:
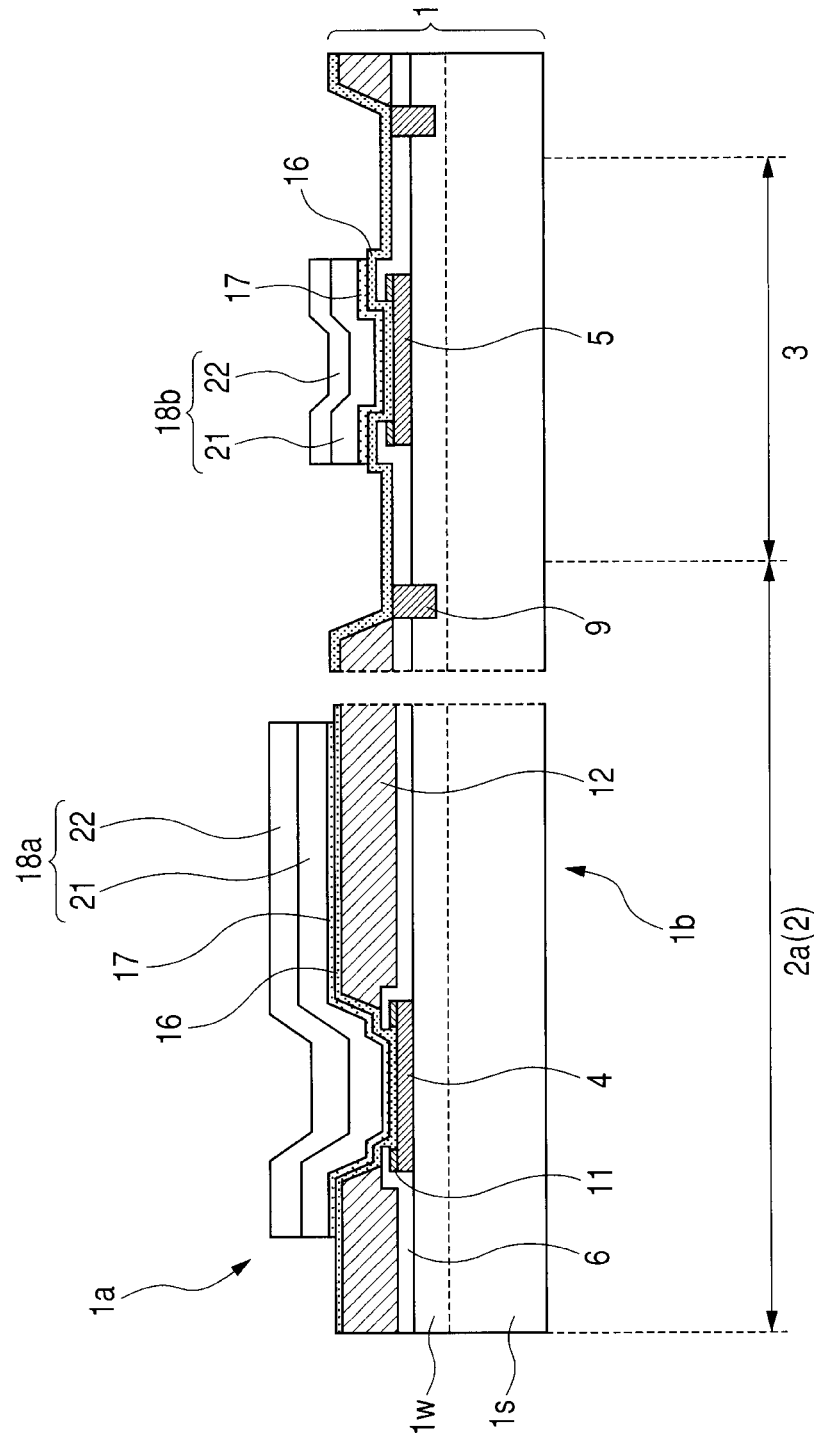
FIG. 6 is a device cross sectional view (upon completion of a step of diffusion barrier metal etching) corresponding to a cross section along X-X' of FIG. 3.

Herein, as shown in FIG. 6, the resist film pattern 14 which has become unnecessary is removed by using, for example, an organic acid type resist removing solution. Electroplating is thus used for the formation of the rewiring layer because it facilitates thick film formation, and also has higher reliability as compared with electroless plating.

Figure 7:
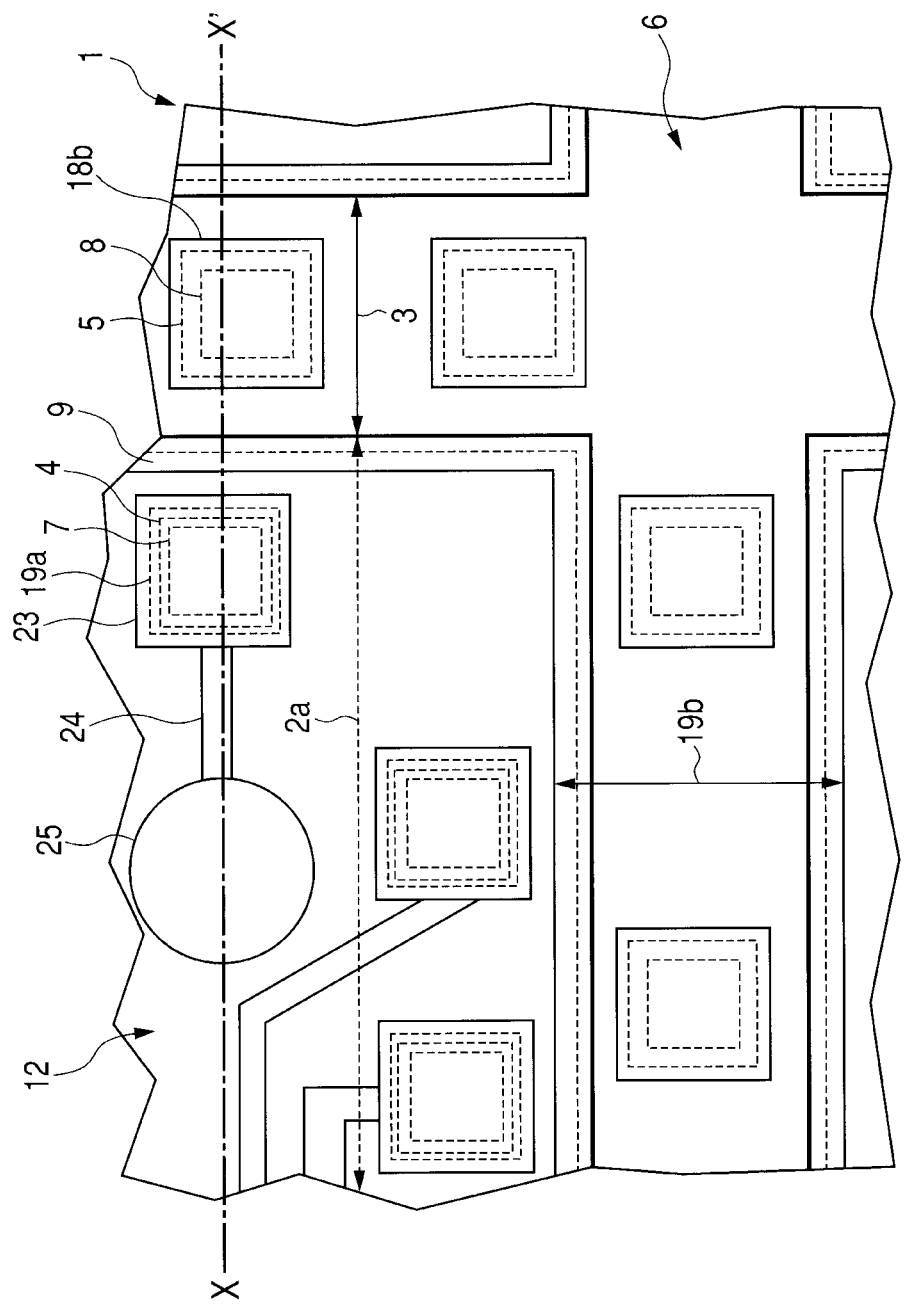
FIG. 7 is a device top view (upon completion of a step of etching of a copper seed layer) for illustrating the process flow in the method for manufacturing a semiconductor integrated circuit device of one embodiment of the present invention.
Figure 8:
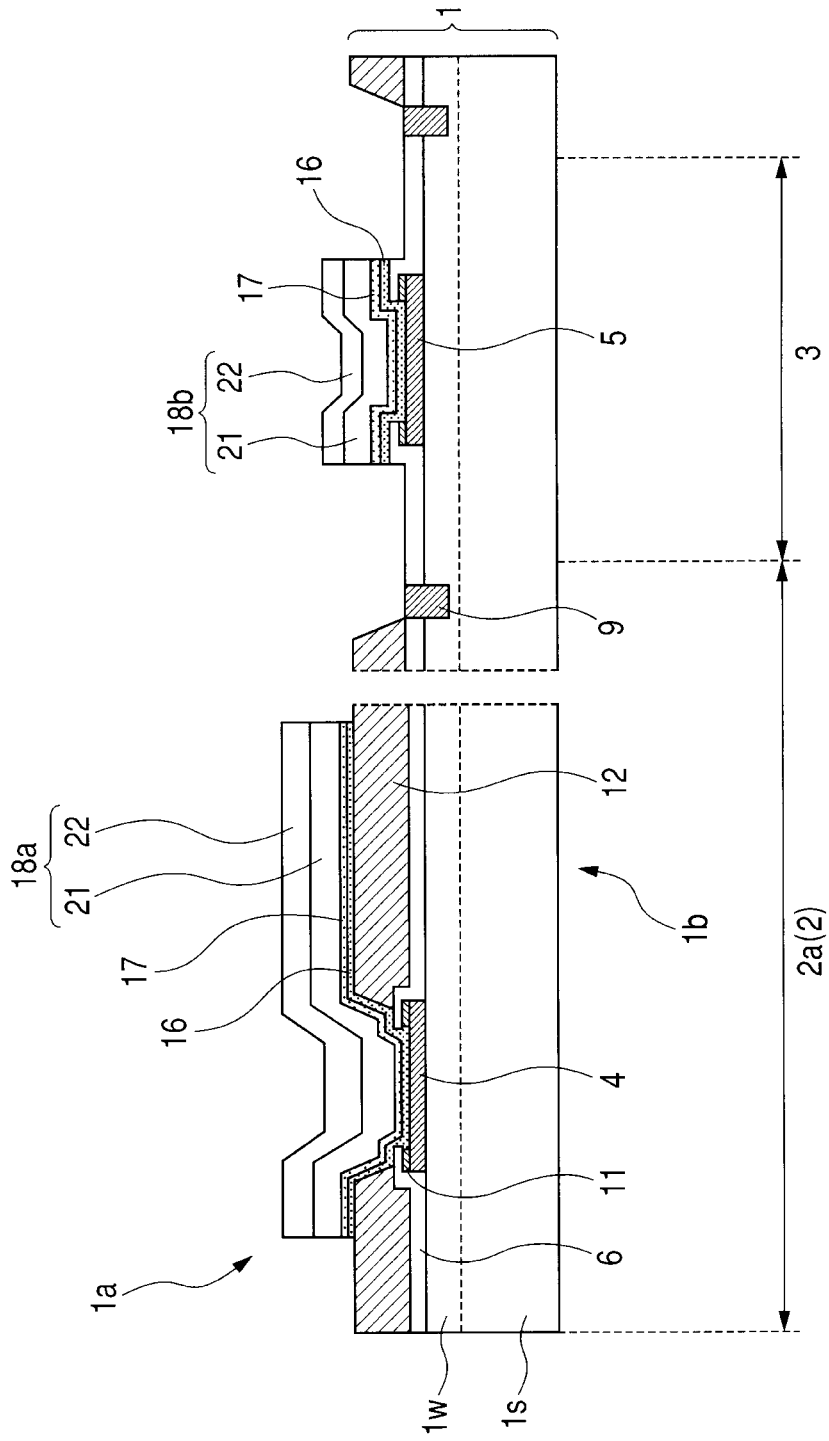
FIG. 8 is a device cross sectional view (upon completion of a step of etching of a copper seed layer) corresponding to a cross section along X-X' of FIG. 7.

Subsequently, as shown in FIGS. 7 and 8 (the cross section along X-X' of FIG. 7), with the rewiring patterns 18a and 18b as an etching mask, the underlayer sputtering layer (seed metal film) which has become unnecessary is removed by wet etching in a self-aligned manner. Specifically, first, by the use of a mixed solution of, for example, sulfuric acid and oxygenated water, the copper seed film 17 is removed. Subsequently, by the use of a solution of, for example, potassium permanganate and sodium metasilicate, the chromium film 16 is removed.

As seen from above at this point in time, the device is as shown in FIG. 7. The on-chip rewiring pattern 18a (electrically coupled with the ordinary wiring layer via the first aluminum type pad electrodes) can be divided in plan configuration into a pad top part 23, a link part 24, and a bump formation part 25 (bump land).

Figure 9:
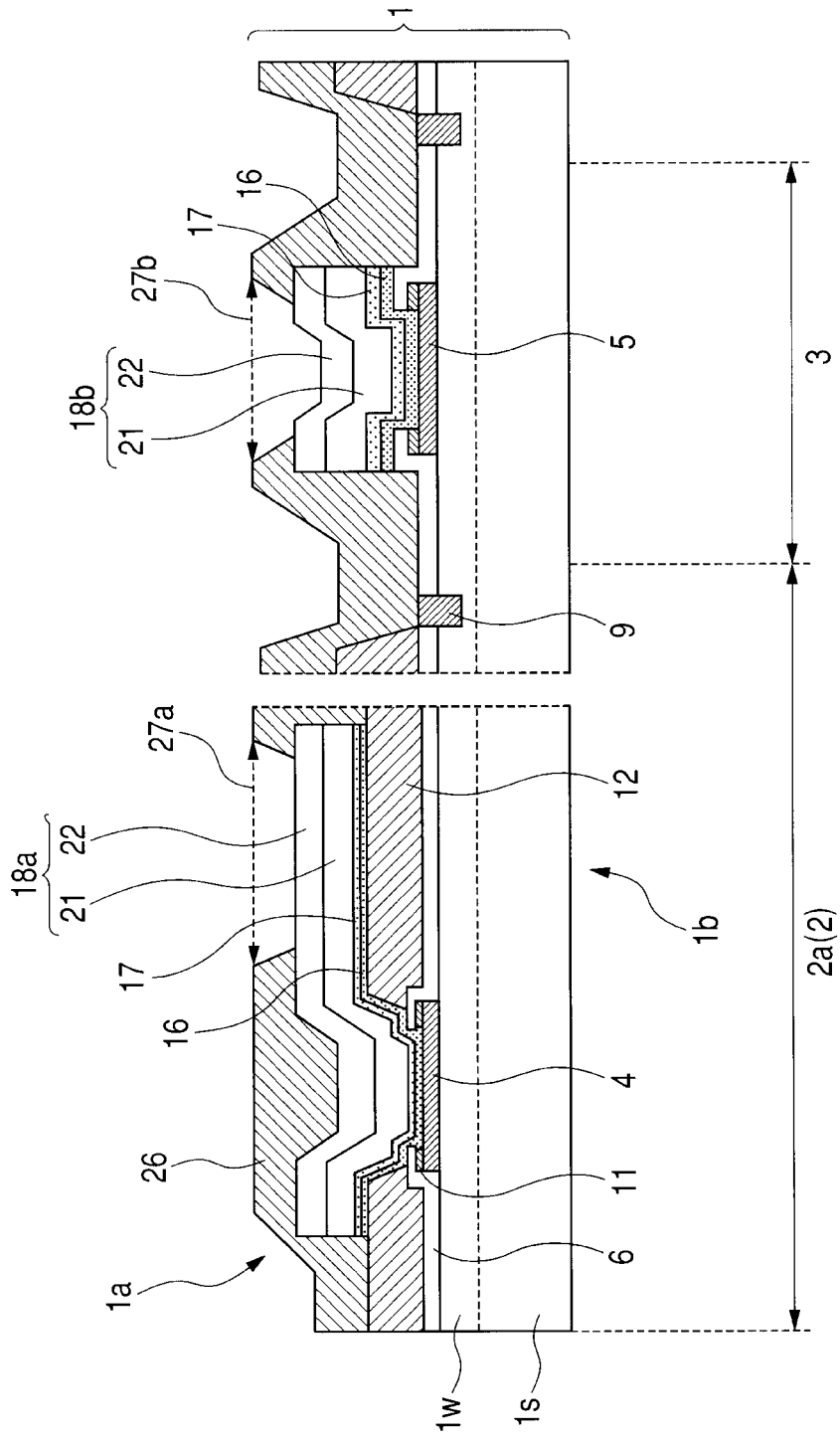
FIG. 9 is a device cross sectional view (upon completion of a step of patterning of an upper layer organic type passivation film) corresponding to a cross section along X-X' of FIG. 7.

Then, as shown in FIG. 9, over almost the entire surface on the device surface 1a side of the semiconductor wafer 1, an upper layer organic type passivation film 26 (organic type insulation film) is formed to open a bump forming opening corresponding to the bump formation part 25 (bump land), namely, a bump forming opening 27a (with an opening diameter of, for example, about 200 micrometers), and an opening 27b (test opening) of the upper layer organic type passivation film in the scribe region. Examples of the organic upper layer final passivation film 7 may include a photosensitive polyimide film (e.g., with a thickness of about 5 micrometers). Resin films of, other than polyimide type, BCB (benzocyclobutene) or other heat resistant polymer type are also acceptable.

Figure 10:
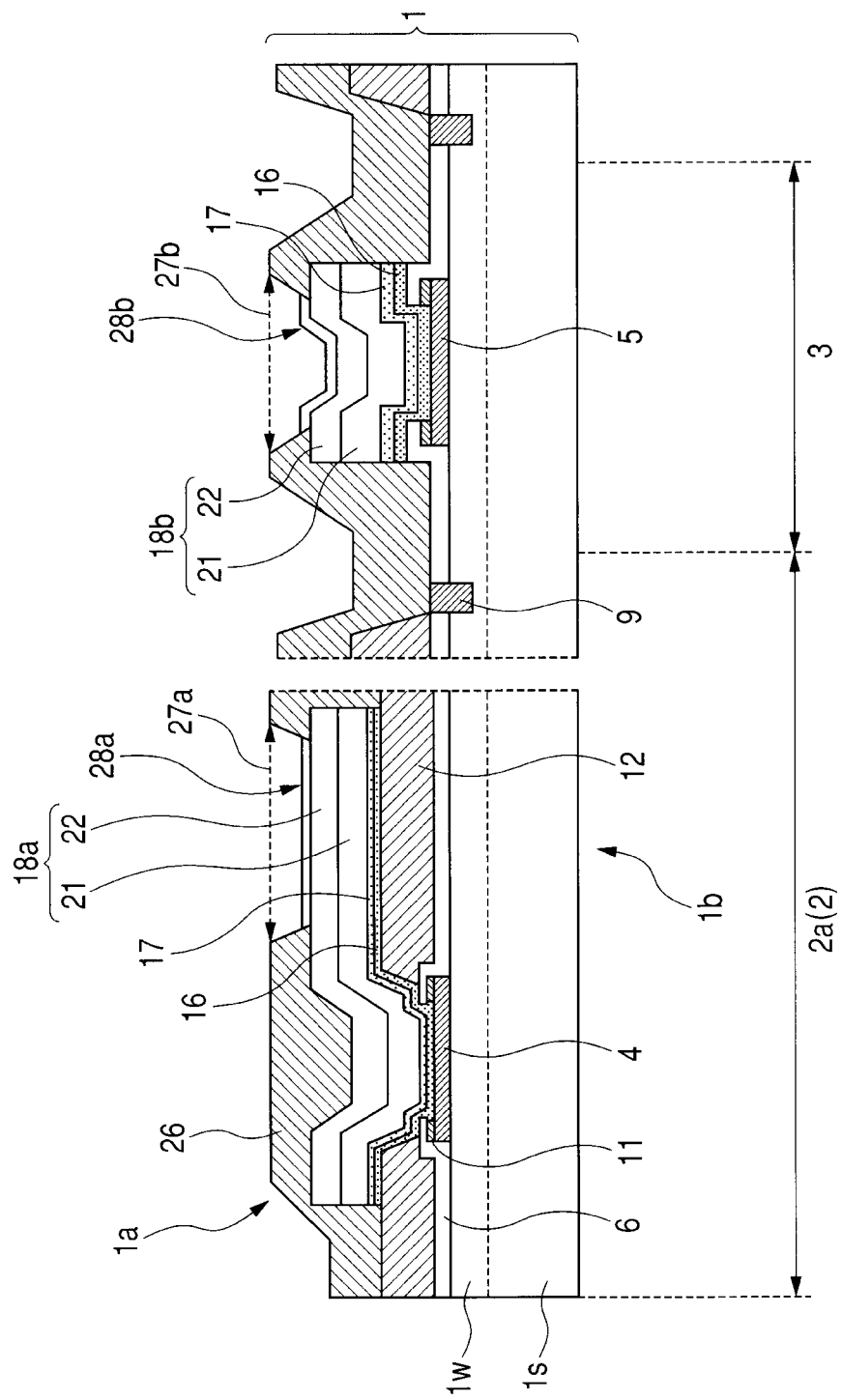
FIG. 10 is a device cross sectional view (upon completion of a step of electroless gold plating on the rewiring top surface) corresponding to a cross section along X-X' of FIG. 7.

Then, as shown in FIG. 10, over the on-chip rewiring pattern 18a and the test wiring pattern 18b corresponding to the bump forming opening 27a and the test opening 27b, respectively, gold plating layers 28a and 28b containing gold as a main component are formed by electroless plating. This step is not necessarily essential, but has an effect of making favorable the wettability of solder and other effects. Further, the step also has a merit of facilitating the probe test and other merits.

Figure 11:
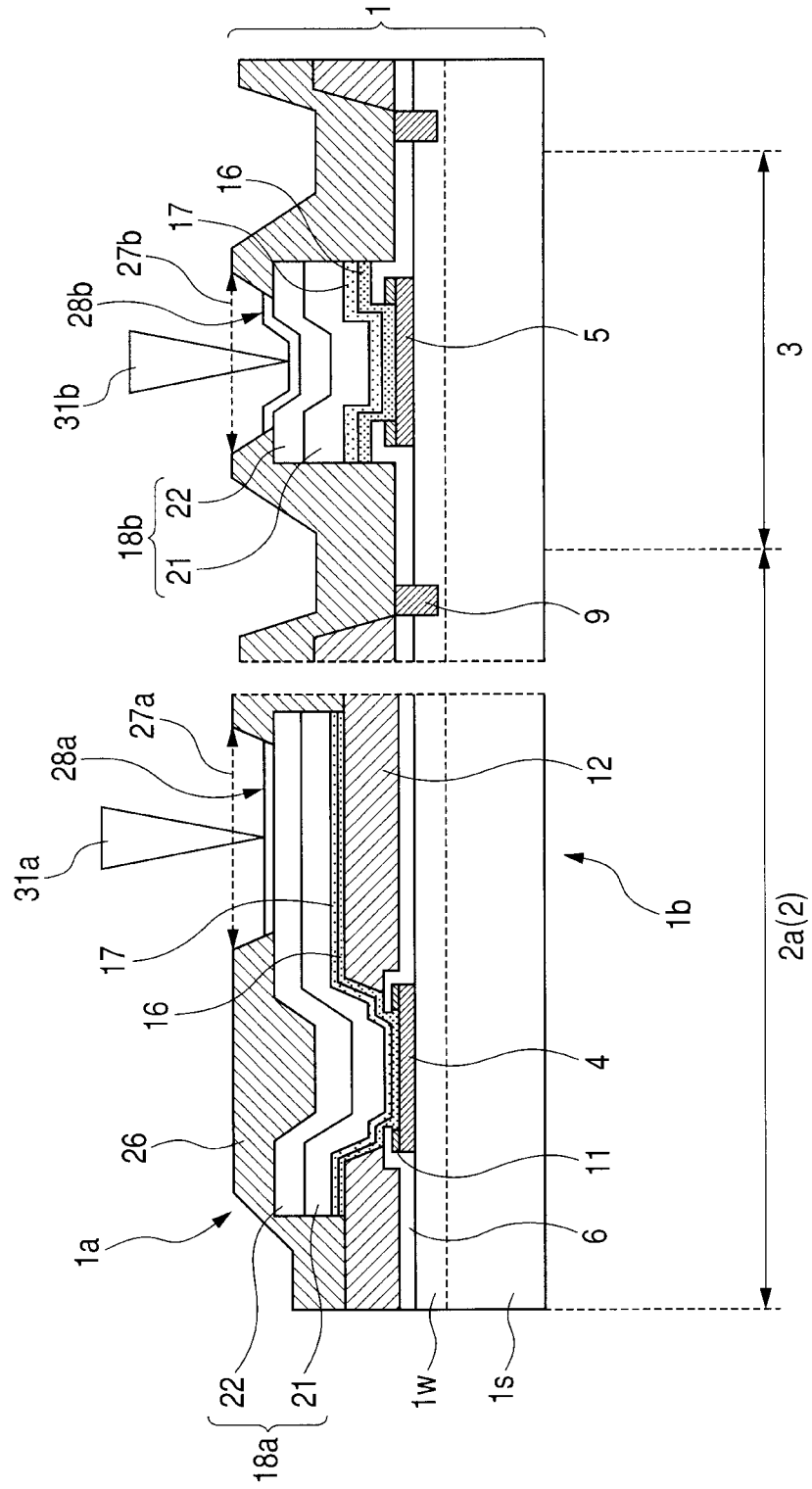
FIG. 11 is a device cross sectional view (wafer probe test step) corresponding to a cross section along X-X' of FIG. 7.

Then, as shown in FIG. 11, the wafer is set in a wafer prober. Thus, on the on-chip rewiring pattern 18a and the test rewiring pattern 18b (specifically, the gold plating layers 28a and 28b), probe needles 31a and 31b are put, respectively. As a result, a wafer probe test is carried out. It is not essential, but is effective from the viewpoints of process monitoring and the like to perform a test by putting the probe needle 31b on the test rewiring pattern 18b. The probe test can also be carried out at other timings.

Figure 12:
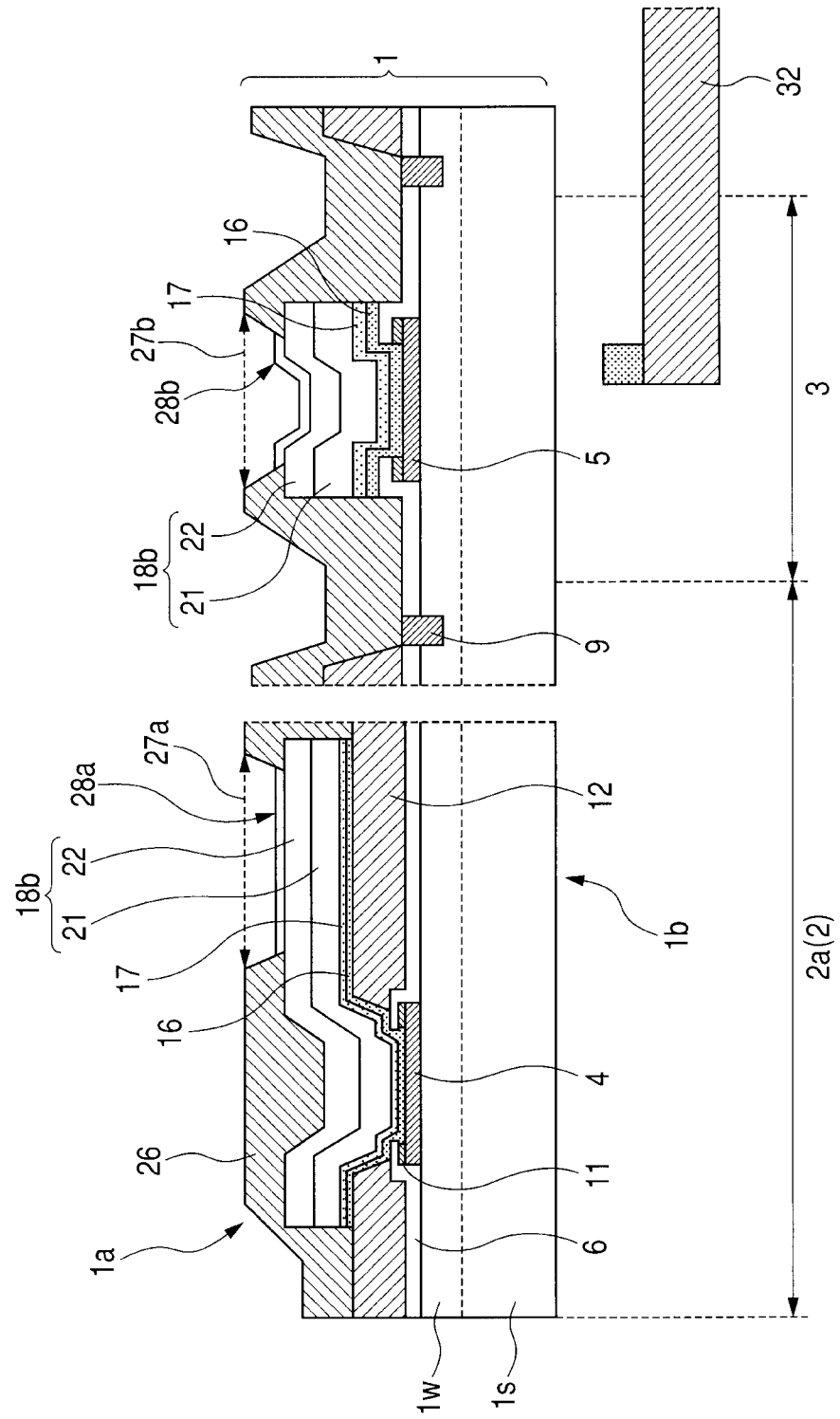
FIG. 12 is a device cross sectional view (upon completion of a back grinding step) corresponding to a cross section along X-X' of FIG. 7.

Then, as shown in FIG. 12, back grinding is carried out by means of a back grinding wheel 32, generally resulting in a wafer thickness of about 100 micrometers to 600 micrometers. Back grinding can be carried out at other timings regardless of before or after the probe test.

Figure 13:
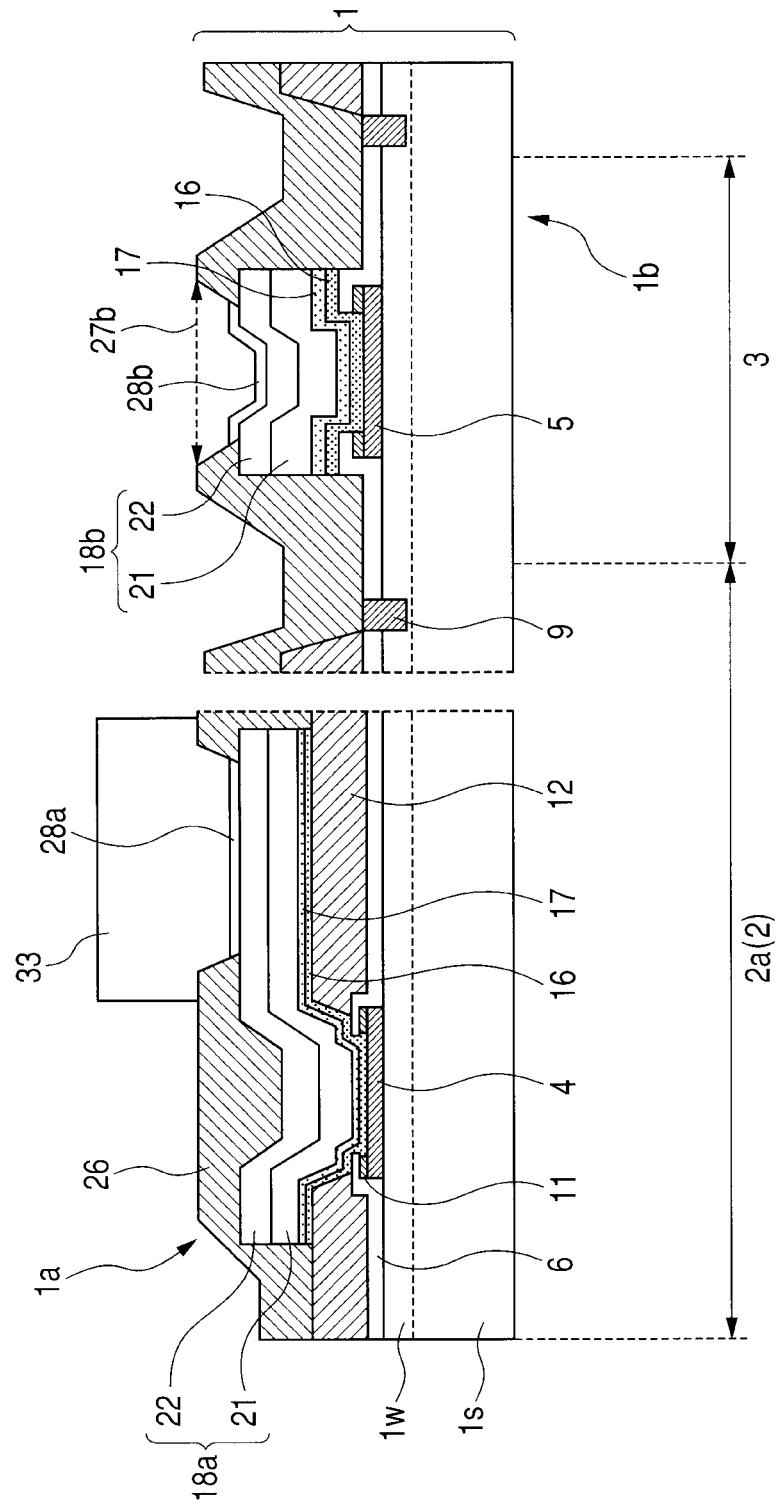
FIG. 13 is a device cross sectional view (upon completion of a solder paste printing step) corresponding to a cross section along X-X' of FIG. 7.

Then, as shown in FIG. 13, a solder paste 33 is formed over each bump formation part 25 by printing or the like.

Figure 14:
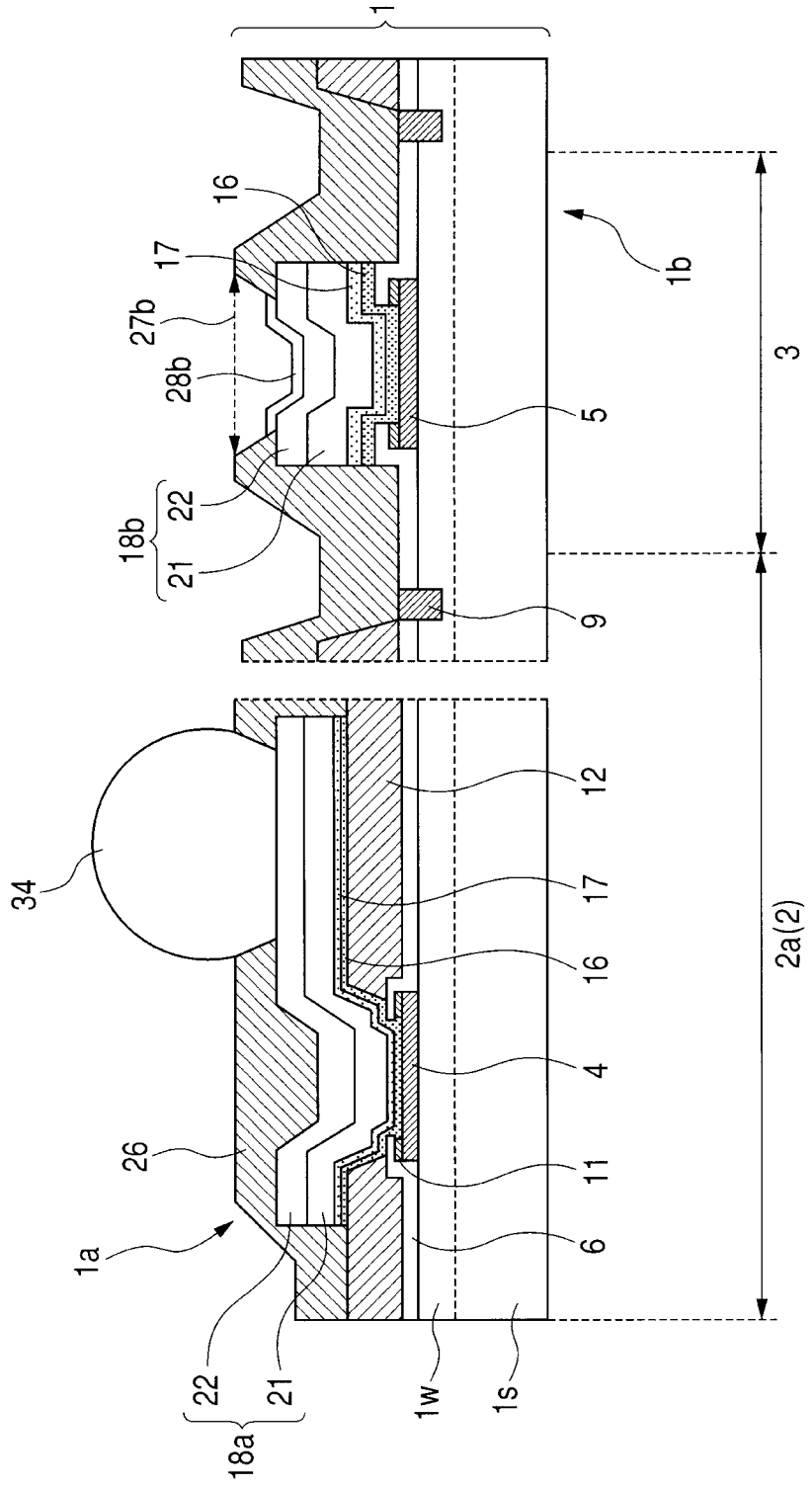
FIG. 14 is a device cross sectional view (upon completion of a solder bump formation step) corresponding to a cross section along X-X' of FIG. 7.

Subsequently, as shown in FIG. 14, a solder bump 34 is formed by a solder reflow processing. Alternatively, the bumps may also be formed in the following manner. For example, a solder flux layer is printed or formed over the surfaces of the bump formation parts 25 (bump lands). Thereover, shaped solder balls are aligned. The solder bump materials are preferably lead-free products. Examples thereof may include Sn—Ag—Cu type alloys, Sn—Cu type alloys, Sn—Ag type alloys, Sn—Ag—Cu—Bi type alloys, and Sn—Ag—Cu—In type alloys. Incidentally, at this time point, a wafer probe test can also be carried out by putting the probe needle 31 on the solder bump 21. After this step, back grinding may be carried out.

The process after the bump formation step will be described in Section 2.

2. Explanation of process flow of a wafer division step and subsequent steps in a method for manufacturing a semiconductor integrated circuit device of one embodiment of the present invention (mainly FIGS. 15 to 20)

Figure 15:
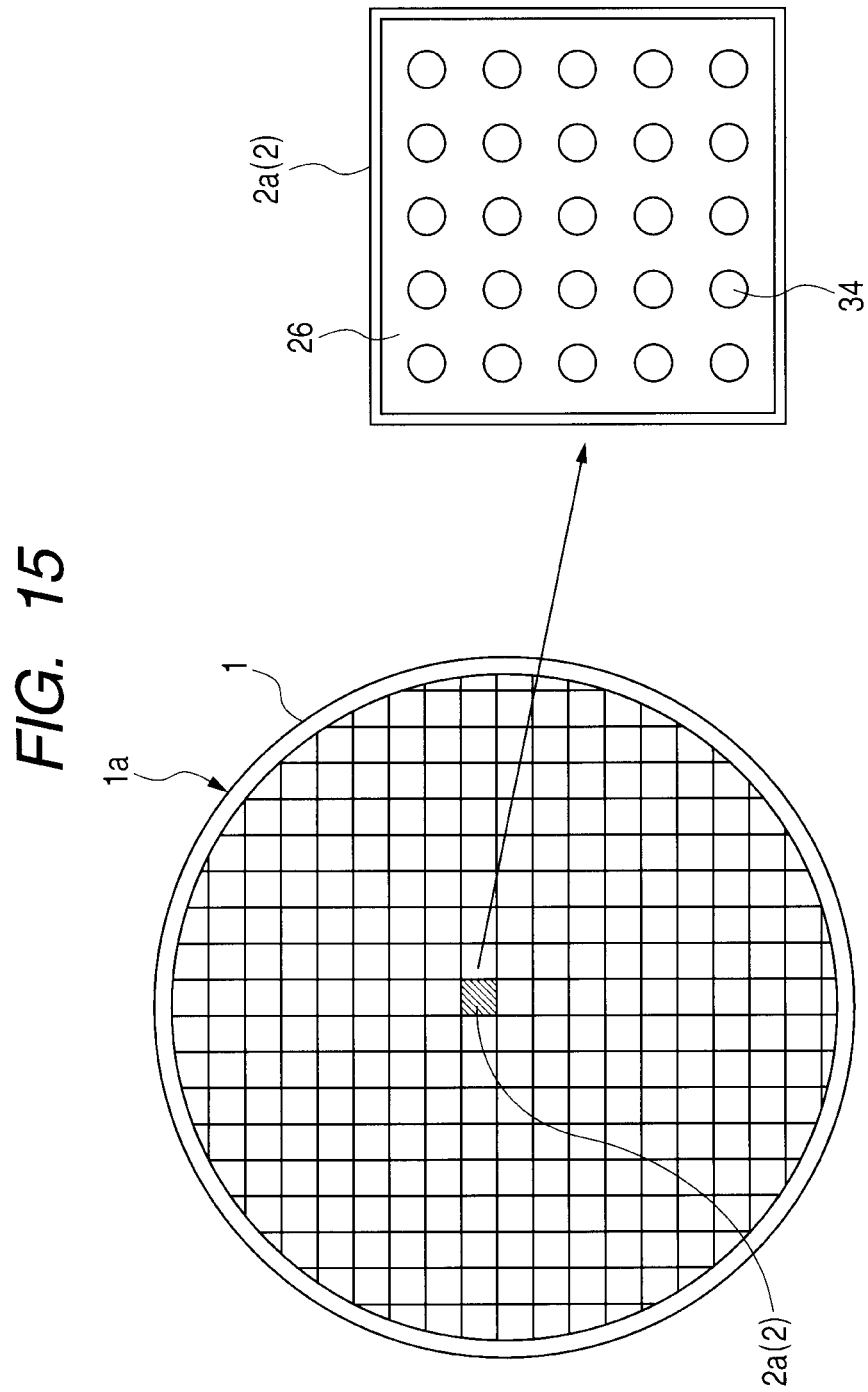
FIG. 15 is a wafer and chip top view for illustrating a dicing step in the method for manufacturing a semiconductor integrated circuit device of one embodiment of the present invention.

Subsequent to the bump formation step, as shown in FIG. 15, a large number of regions 2 over the device surface 1a of the semiconductor wafer 1 are cut along the dicing region 3 in the directions X and Y by dicing (a rotary blade or laser, or both thereof), thereby to be divided into individual chips 2. Herein, there is also a method using back grinding in combination (so-called DBG method). Below, the details of the dicing process will be described specifically by reference to FIGS. 16 to 19.

Figure 16:
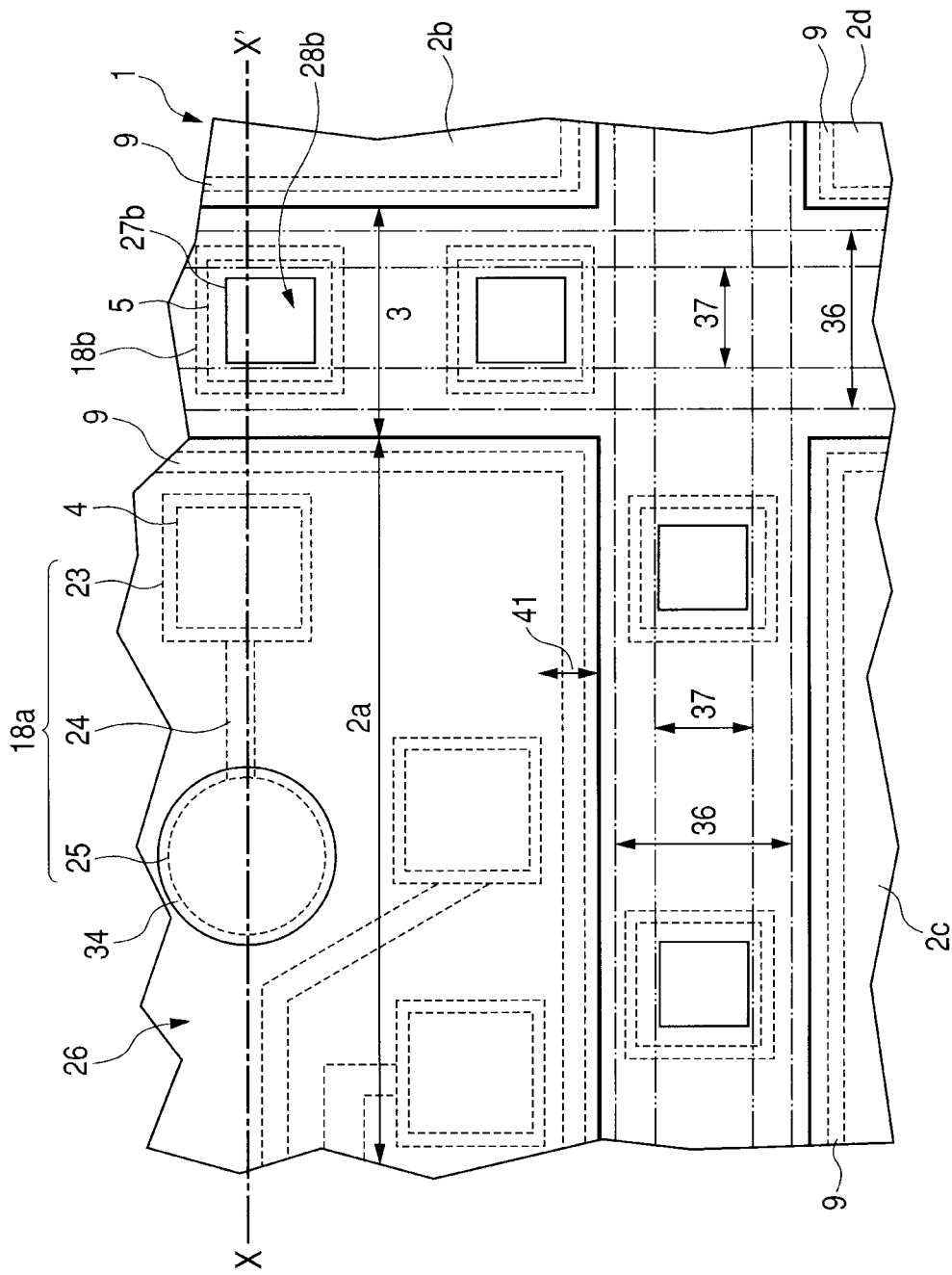
FIG. 16 is a wafer top surface enlarged view for illustrating the dicing step in the method for manufacturing a semiconductor integrated circuit device of one embodiment of the present invention.
Figure 17:
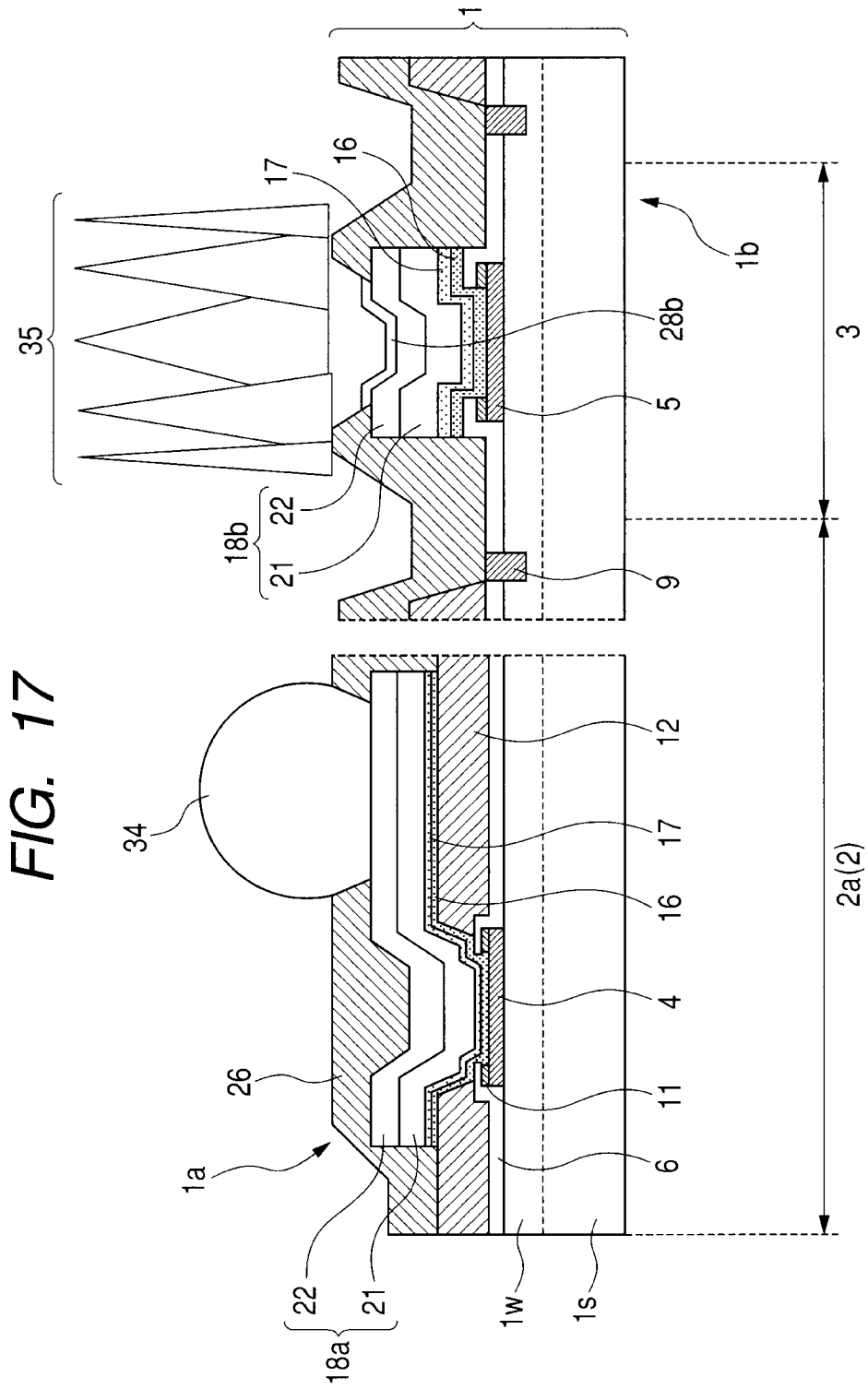
FIG. 17 is a device cross sectional view (upon start of a laser grooving step) corresponding to a cross section along X-X' of FIG. 16.
Figure 18:
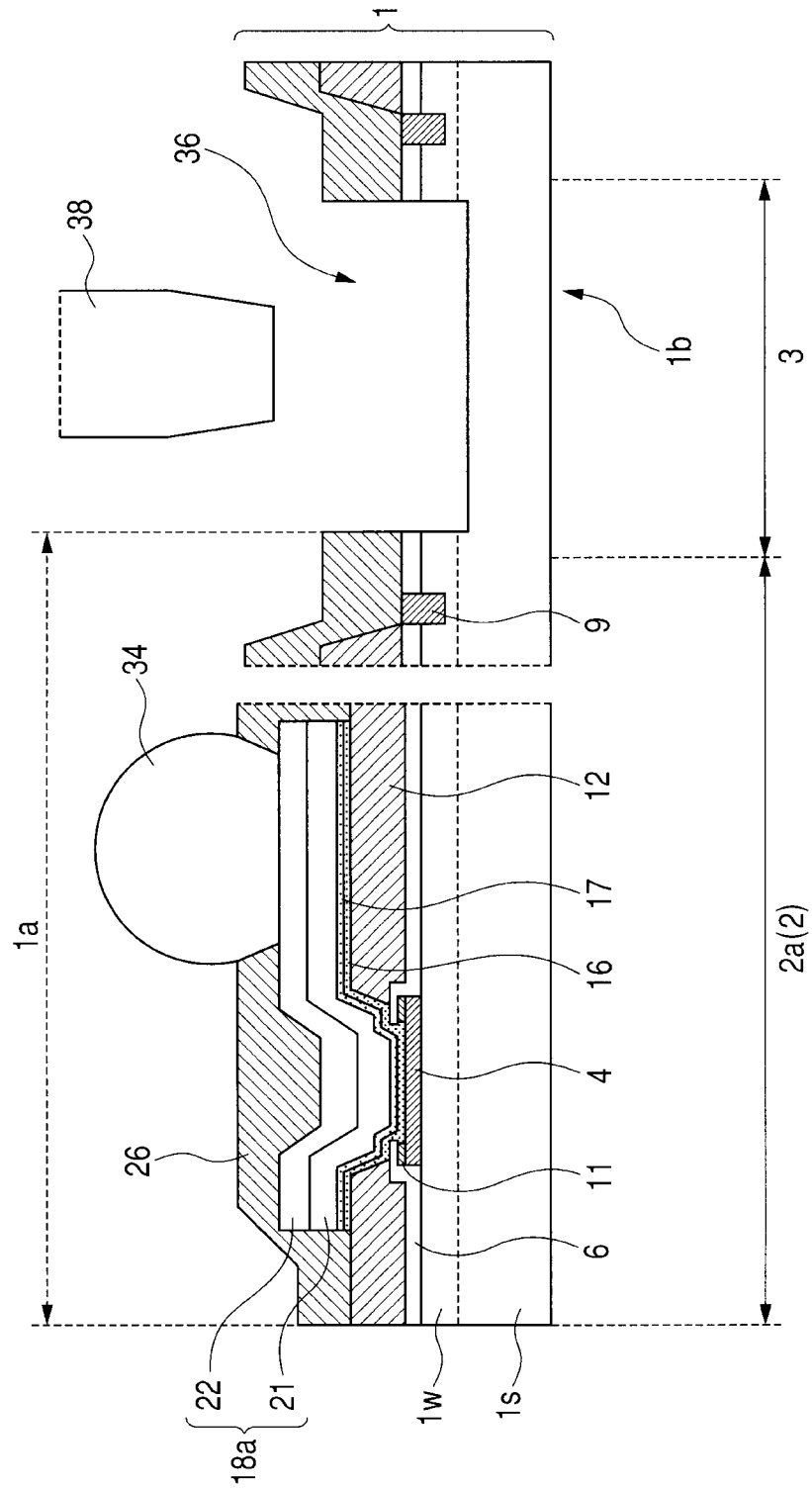
FIG. 18 is a device cross sectional view (upon start of a blade dicing step) corresponding to a cross section along X-X' of FIG. 16.

As shown in FIGS. 16, 17, and 18, a laser beam 35 is exposed and scanned from the device surface 1a (first main surface) side of the wafer 1 (laser grooving). As a result, the multilayered structure at the central part of the scribe region 3 of the device surface 1a of the wafer 1 is removed. Scanning can be carried out in the following manner. For example, scanning is carried out through five passes in which the intensity is stronger at the center, and is weakened toward the periphery. Examples of the scan rate may include about 100 to 600 mm/sec. At this step, it is preferable to remove all of the uppermost layer pad electrodes 5 (second aluminum type pad electrodes) of the common wiring in the scribe region 3, and the test rewiring pattern thereover. This is not essential but effective for preventing the outflow of know-how of the test and preventing the occurrence of foreign matters and the like in the subsequent steps. As a result of the laser grooving, grooves 36 (broad grooves or laser grooves) as shown in FIGS. 16 and 18 are formed. Further, preferably, the bottom of each groove 36 reaches the single crystal substrate part of the semiconductor wafer or the semiconductor substrate including the source/drain regions, the well regions, and the like, namely, the substrate region 1s (p type silicon single crystal substrate) across the multilayer wiring layer 1w under the pads (including the gate electrodes, the premetal layer, and the like). This is also not essential. However, this produces an effect of reducing damages on the chip 2 side especially when the multilayer wiring layer 1w includes a Low-k insulation film layer (an insulation film with a relative dielectric constant of 3 or less) of, for example, a SiOC film or a SiCO film.

Figure 19:
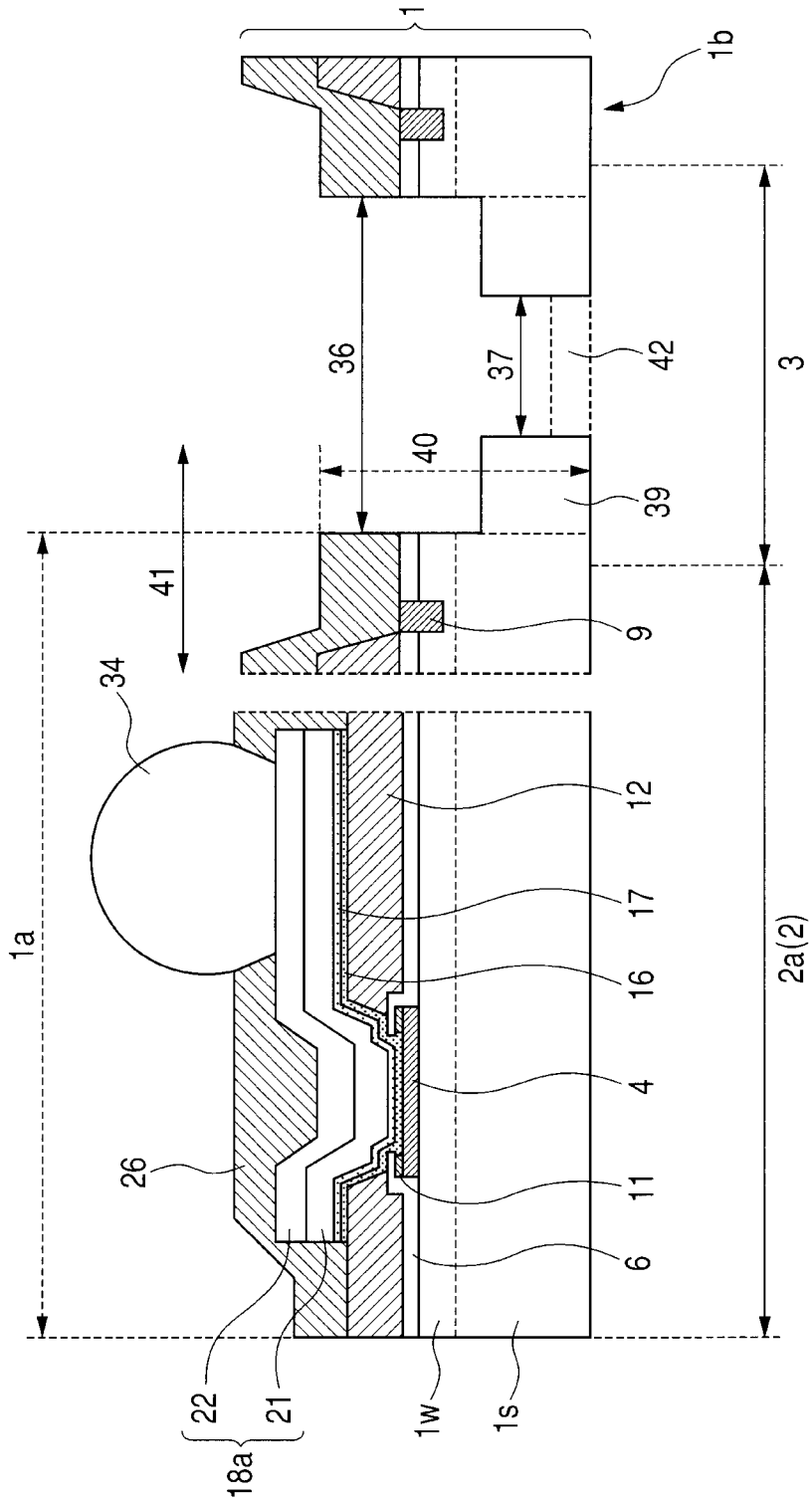
FIG. 19 is a device cross sectional view (upon completion of a blade dicing step) corresponding to a cross section along X-X' of FIG. 16.

Then, as shown in FIGS. 16, 18, and 19, by means of a dicing blade 38 thinner than the laser groove 36, a dicing processing (full cut reaching the dicing tape to which the back surface 1b of the wafer 1 is attached) is carried out on the bottom of the groove 36 by the use of a dicing device. As a result, a chip separation groove 37 (narrow groove) is formed. This separates the wafer 1 into individual chips 2 with the back surface 1b attached to the dicing tape.

As described above, as the first step of dicing, the organic type film over the surface is removed by not a blade dicing processing, but laser grooving (a laser grooving processing which is a laser processing). This enables a smoother processing as compared with the blade dicing processing causing a large load on the blade. Further, the damage to the device side is also less. Whereas, the second step of dicing is accomplished through blade dicing by the dicing blade 38 (with a blade thickness of, for example, about 30 to 50 micrometers) thinner than the laser groove 36. As a result, the damage to the device part can be minimized. Further, the process cost can also be controlled low.

On the other hand, in the case of the DBG method, half cutting is carried out by the foregoing dicing blade 38 so as to leave the residual portion 42 shown in FIG. 19. Then, back grinding is carried out, resulting in separation into individual chips 2.

Each chip 2 formed (separated) by each of these methods includes, as shown in FIG. 19, the upper layer organic type passivation film 26 (organic type insulation film) formed thereover to the end 41 of the device surface 1a of the chip 2 across the seal ring 9. This can improve the reliability of the device. Further, there is a projection 39 at the lower part of the side surface 40 of the chip 2 (or the semiconductor substrate circumferential side surface). This offers a merit of enabling prevention of chipping of the top part of the end 41 of the chip 2 more sensitive to device characteristics.

Figure 20:
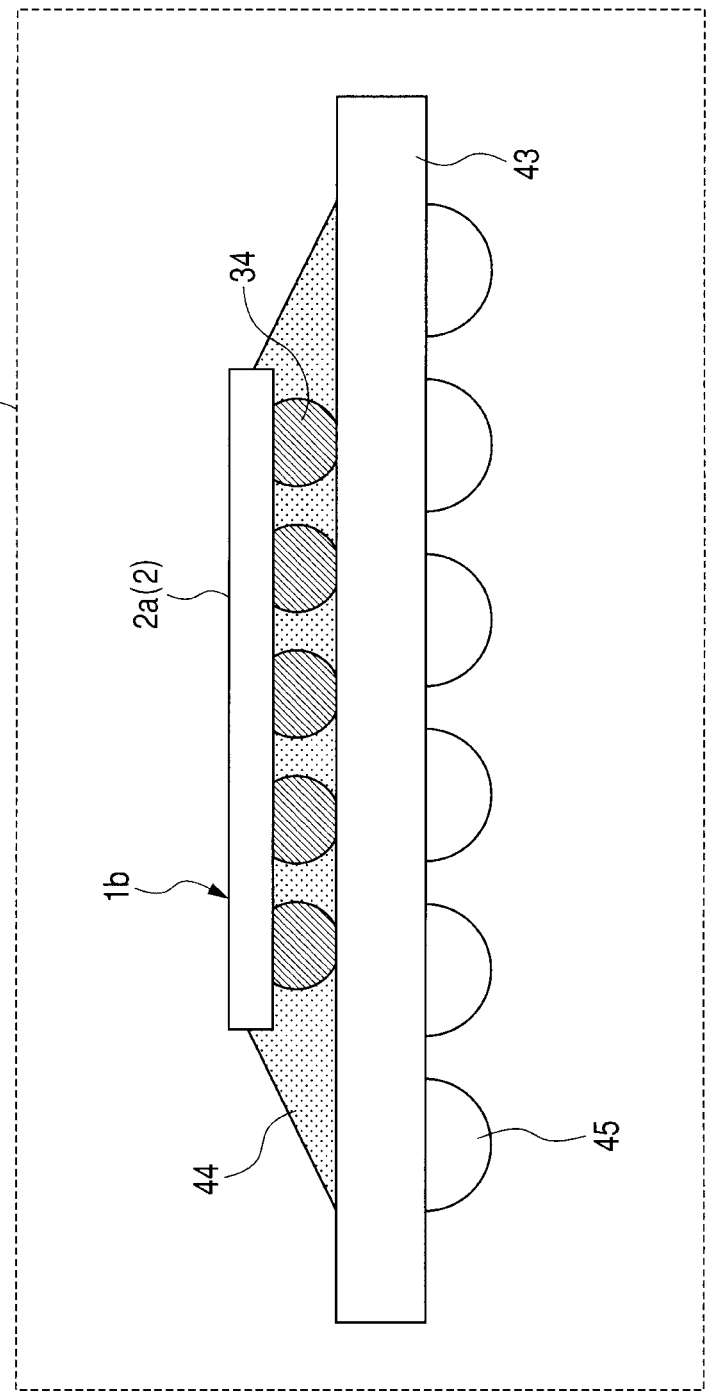
FIG. 20 is a cross sectional view of a package which is the final product in the method for manufacturing a semiconductor integrated circuit device of one embodiment of the present invention.

Then, as shown in FIG. 20 (showing herein a package final form including a chip flip-chip mounted on a wiring substrate with bumps), over a wiring substrate 43 (organic multilayer wiring substrate), the chip 2 is, for example, flip-chip coupled, and an underfill resin 44 is charged therein for reinforcement. Herein, over the underside of the wiring substrate 43, external solder bumps 45 are provided.

3. Explanation of device cross sectional structure upon completion of a pad opening over an aluminum type pad in a semiconductor integrated circuit device of one embodiment of the present invention (mainly FIGS. 21 and 22)

In this section, there is shown one example of the detailed device cross sectional structure of the chip region pad peripheral region R1 (the periphery of the bonding pad 4) and the seal ring peripheral region R2 (the periphery of the seal ring 9) shown in FIGS. 1 and 2.

Figure 21:
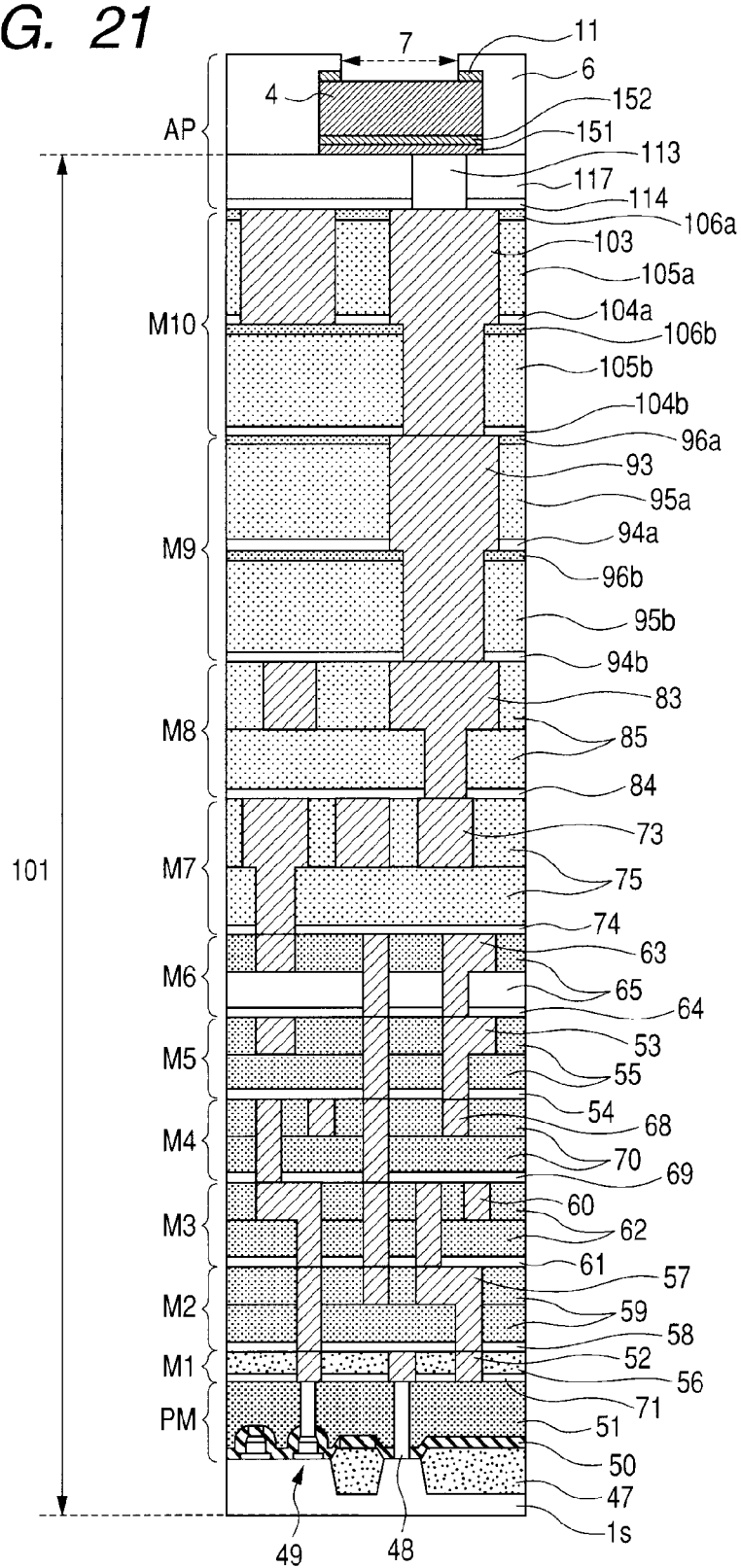
FIG. 21 is a device schematic cross sectional view (corresponding to a chip region pad peripheral region R1 of FIG. 2, i.e., a detailed description of a structure of an aluminum type pad 4, and the underlying part thereof) showing one example of the device cross section upon completion of an aluminum type pad opening step in the method for manufacturing a semiconductor integrated circuit device of one embodiment of the present invention.

FIG. 21 is a device cross sectional view (upon completion of a pad opening) showing one example of the cross sectional structure of a 65-nm technology node device according to the method for manufacturing a semiconductor integrated circuit device of the embodiment of the present invention. By reference to these drawings, a description will be given to the outline of the device structure of the semiconductor integrated circuit device of the embodiment of the present application.

As shown in FIG. 21, for example, over the device surface of the P type single crystal silicon substrate is isolated by a STI (Shallow Trench Isolation) type element isolation field insulation film 47, a gate electrode 49 of a P channel MOSFET or an N channel MOSFET is formed. Thereover, a silicon nitride liner film 50 (e.g., about 30 nm) which is an etch stop film is formed. Thereover, there is formed a premetal interlayer insulation film 51 much thicker than the silicon nitride liner film 50, and including a lower layer ozone TEOS silicon oxide film (e.g., about 200 nm) by a thermal CVD process, an upper layer plasma TEOS silicon oxide film (e.g., about 270 nm), and the like. Further, there is formed a tungsten plug 48 penetrating through the premetal insulation films. The part described up to this point is a premetal region PM.

A first wiring layer M1 thereover includes a lower layer insulation barrier film 71 such as a SiCN film (e.g., about 50 nm), a plasma silicon oxide film 56 (e.g., about 150 nm) which is a main interlayer insulation film, and the like, and a copper wire 52 embedded in a wiring groove formed therein, and the like.

Second to sixth wiring layers M2, M3, M4, M5, and M6 thereover have mutually almost the same structure. Respective layers each include their corresponding lower layer composite insulation barrier films (liner films) 58, 61, 69, 54, and 64 including a SiCO film (e.g., about 30 nm/a SiCN film (e.g., about 30 nm), and the like, and their corresponding main interlayer insulation films 59, 62, 70, 55, and 65 accounting for the most region of the upper layer, and the like. The main interlayer insulation films 59, 62, 70, 55, and 65 each include, from the lower layer, a carbon-doped silicon oxide film, i.e., a SiOC film (e.g., about 350 nm), a plasma TEOS silicon oxide film (e.g., about 80 nm) which is a cap film, and the like. Copper embedded wires 57, 60, 68, 53, and 63 each including a copper plug and a copper wire are formed through the interlayer insulation films.

A seventh wiring layer M7 and an eighth wiring layer M8 thereover have mutually almost the same structure. Respective layers include lower layer insulation barrier films 74 and 84 such as SiCN films (e.g., about 70 nm), respectively, and upper layer main interlayer insulation films 75 and 85, respectively, and the like. The main interlayer insulation films 75 and 85 each include, from the lower layer, a plasma TEOS silicon oxide film (e.g., about 250 nm), a FSG film (e.g., about 300 nm), a USG film (e.g., about 200 nm) which is a cap film, and the like. Copper embedded wires 73 and 83 each including a copper plug and a copper wiring are formed through the interlayer insulation films.

A ninth wiring layer M9 and a tenth wiring layer M10 thereover have mutually almost the same structure. Each layer is divided into a lower layer interlayer and an upper layer intralayer. The interlayer insulation films include lower layer insulation barrier films 94b and 104b such as a SiCN film (e.g., about 70 nm), upper layer main interlayer insulation films, and the like. The main interlayer insulation films respectively include lower layer FSG films 95b and 105b (e.g., about 800 nm), USG films 96b and 106b (e.g., about 100 nm) which are cap films, and the like. Whereas, the intralayer insulation films respectively include lower layer insulation barrier films 94a and 104a such as SiCN films (e.g., about 50 nm), upper layer main interlayer insulation films, and the like. The main intralayer insulation films respectively include lower layer FSG films 95a and 105a (e.g., about 1200 nm), upper layer USG films 96a and 106a (e.g., about 100 nm) which are cap films, and the like. Copper embedded wires 93 and 103 each including a copper plug and a copper wire are formed through the interlayer insulation films, the intralayer insulation films, and the like.

An uppermost layer wiring layer (pad layer) AP thereover includes a lower layer insulation barrier film such as a SiCN film 114 (e.g., about 100 nm), an intermediate main interlayer insulation film such as a USG film 117 (e.g., about 900 nm), outermost final passivation film such as plasma SiN 6 (e.g., about 600 nm), and the like. Further, a tungsten plug 113 is provided through the interlayer insulation films. Over the USG film 117, an aluminum type bonding pad 4 (e.g., about 1000 nm) is provided. The aluminum type bonding pad 118 and the tungsten plug 113 are, if required, provided with a lower layer titanium adhesion layer 151 (e.g., about 10 nm) and an upper layer titanium nitride barrier metal layer 152 (e.g., about 30 nm). Further, over the bonding pad 4 (the main aluminum type metal layer 118 of the uppermost layer aluminum type wiring), a titanium nitride layer 11 (e.g., about 70 nm) is formed. An opening is formed in this film and the plasma SiN 6, resulting in a bonding pad opening 7.

Incidentally, in place of the aluminum type bonding pad 4, a copper type bonding pad is also acceptable.

Figure 22:
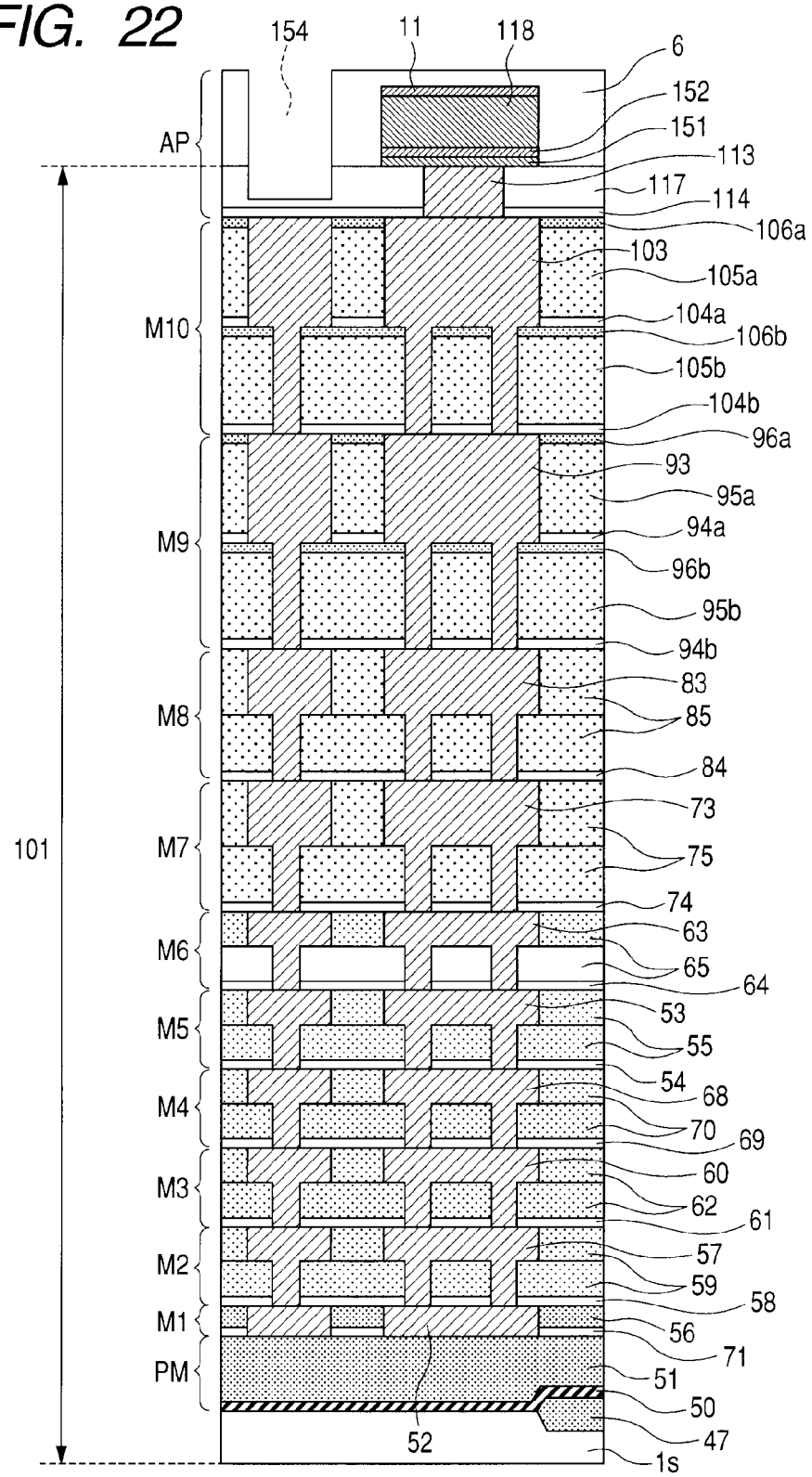
FIG. 22 is a device schematic cross sectional view (corresponding to a seal ring peripheral region R2 of FIG. 2, i.e., a detailed description of a structure of a seal ring 9) showing one example of the device cross section upon completion of an aluminum type pad opening step in the method for manufacturing a semiconductor integrated circuit device of one embodiment of the present invention.

Then, by reference to FIG. 22, a description will be given to one example of the detailed device cross sectional structure of the seal ring peripheral region R2 (the periphery of the seal ring 9). As shown in FIG. 22, respective interlayer insulation films and the like 54, 55, 56, 58, 59, 61, 62, 64, 65, 69, 70, 71, 74, 75, 84, 85, 94a, 94b, 95a, 95b, 96a, 96b, 104a, 104b, 105a, 105b, 106a, 106b, 114, and 117, and the metal structures (the wiring structures and the pads) 11, 52, 53, 57, 60, 63, 68, 73, 83, 93, 103, 113, 118, 151, and 152 over the premetal region PM (the premetal interlayer insulation film 51) are equal to their respective corresponding elements described by reference to FIG. 21 (i.e., formed of the insulation film or the metal layer at the same layer). Therefore, a description thereon will not be repeated. However, in the case of the seal ring 9, the wiring structure acts not merely as wiring but mainly as a reinforcing member or a reinforcing wall. Further, similarly, the main layer 118 of the uppermost layer aluminum type wire (corresponding to the uppermost layer pad electrode 4 of the common wiring of FIG. 21), and the like mainly act as ring-shaped metal reinforcing members in the vicinity of the top surface. Whereas, on the scribe region 3 side of the uppermost layer wiring layer AP, a crack trap trench 154 is provided in such a manner as to surround the outer peripheral part of the chip. Therefore, in this example, the crack trap trench 154 and the ring-like wall of the two-row metal structure prevent propagation of cracks. Incidentally, in general, the crack trap trench 154 is formed simultaneously with the formation of the opening 7 of the inorganic type passivation film (FIG. 21). Further, the metal structure is generally coupled to a ground potential.

4. Explanation of semiconductor manufacturing devices (laser grooving device and blade dicing device) for use in a method for manufacturing a semiconductor integrated circuit device of one embodiment of the present invention (mainly FIGS. 23 to 25)

Herein, for convenience, a description will be given by taking a case where a laser grooving device and a blade dicing device are stand-alone as an example. However, it is naturally understood that an integrated device including both is also acceptable.

Figure 23:
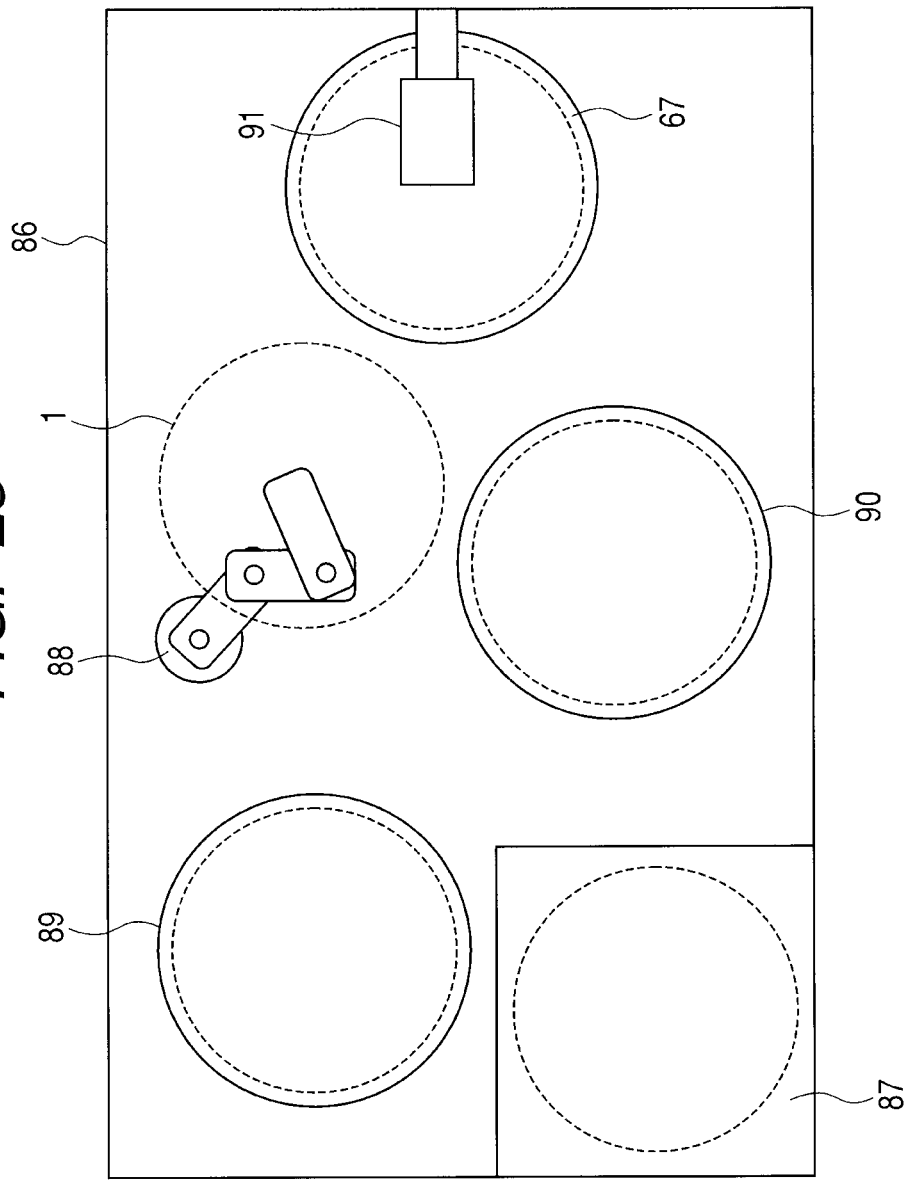
FIG. 23 is a planar layout view of a laser grooving device for use in a laser grooving step in the method for manufacturing a semiconductor integrated circuit device of one embodiment of the present invention.
Figure 24:
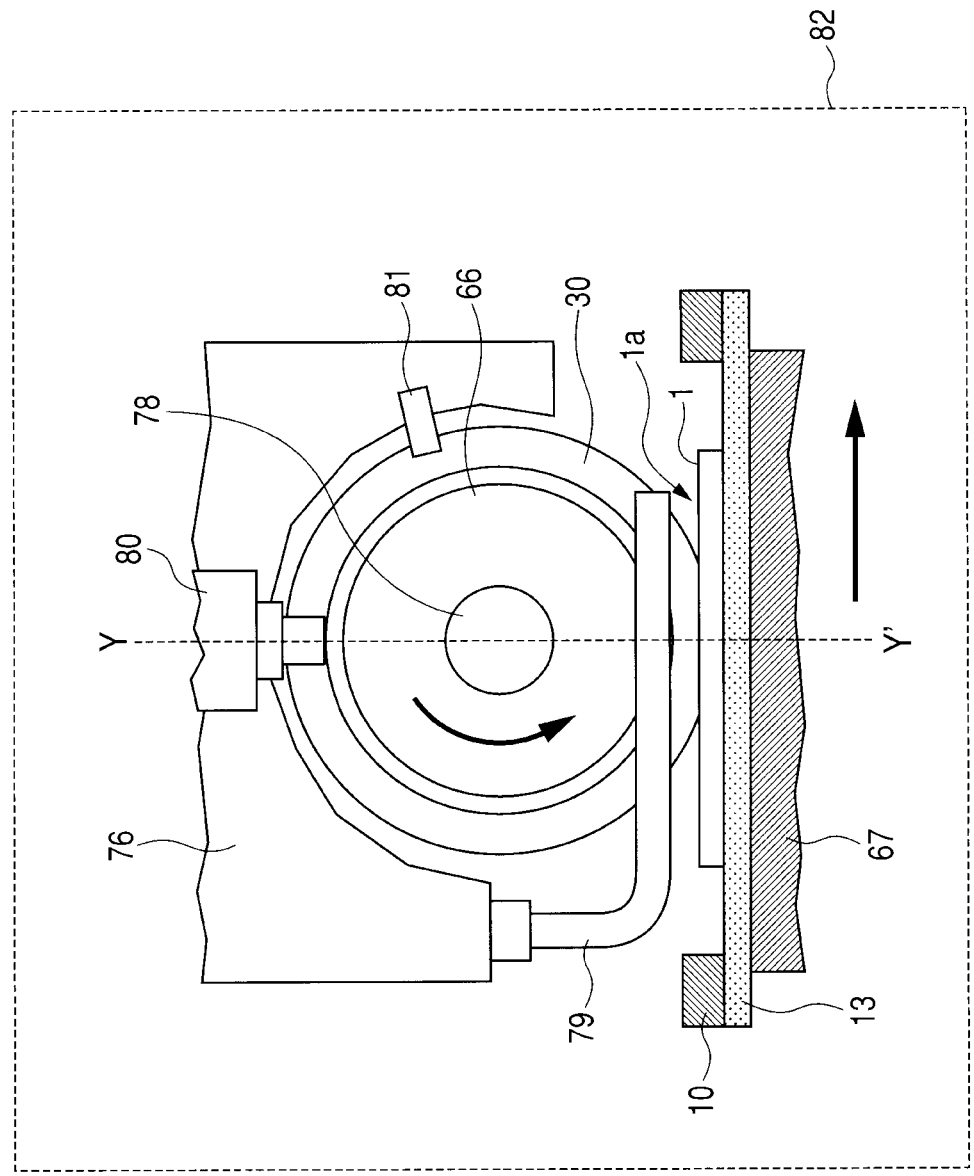
FIG. 24 is a side view of an essential part of a blade dicing device for use in a blade dicing step in the method for manufacturing a semiconductor integrated circuit device of one embodiment of the present invention.
Figure 25:
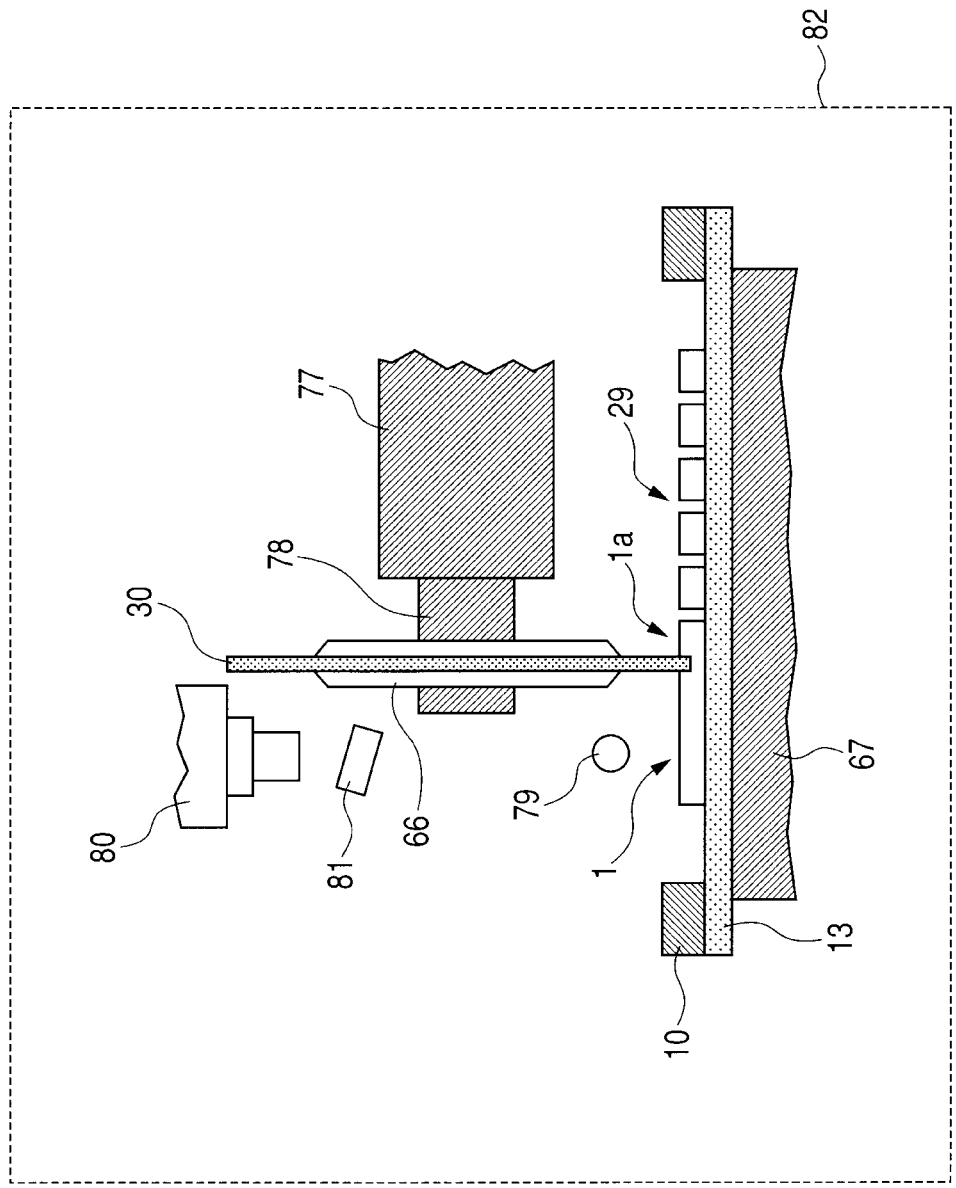
FIG. 25 is a cross sectional view of an essential part of the blade dicing device corresponding to the cross section along Y-Y' of FIG. 24.

FIG. 23 is a planar layout view of a laser grooving device 86 for use in the laser grooving step in the method for manufacturing a semiconductor integrated circuit device of one embodiment of the present invention. FIG. 24 is a side view of an essential part of a blade dicing device for use in the blade dicing step in the method for manufacturing a semiconductor integrated circuit device of one embodiment of the present invention. FIG. 25 is a cross sectional view of an essential part of the blade dicing device corresponding to the cross section along Y-Y' of FIG. 24. By reference to these drawings, a description will be given to the outline of the structure and operation of the semiconductor manufacturing devices (the laser grooving device and the blade dicing device) for use in the method for manufacturing a semiconductor integrated circuit device of one embodiment of the present invention.

Figure 27:
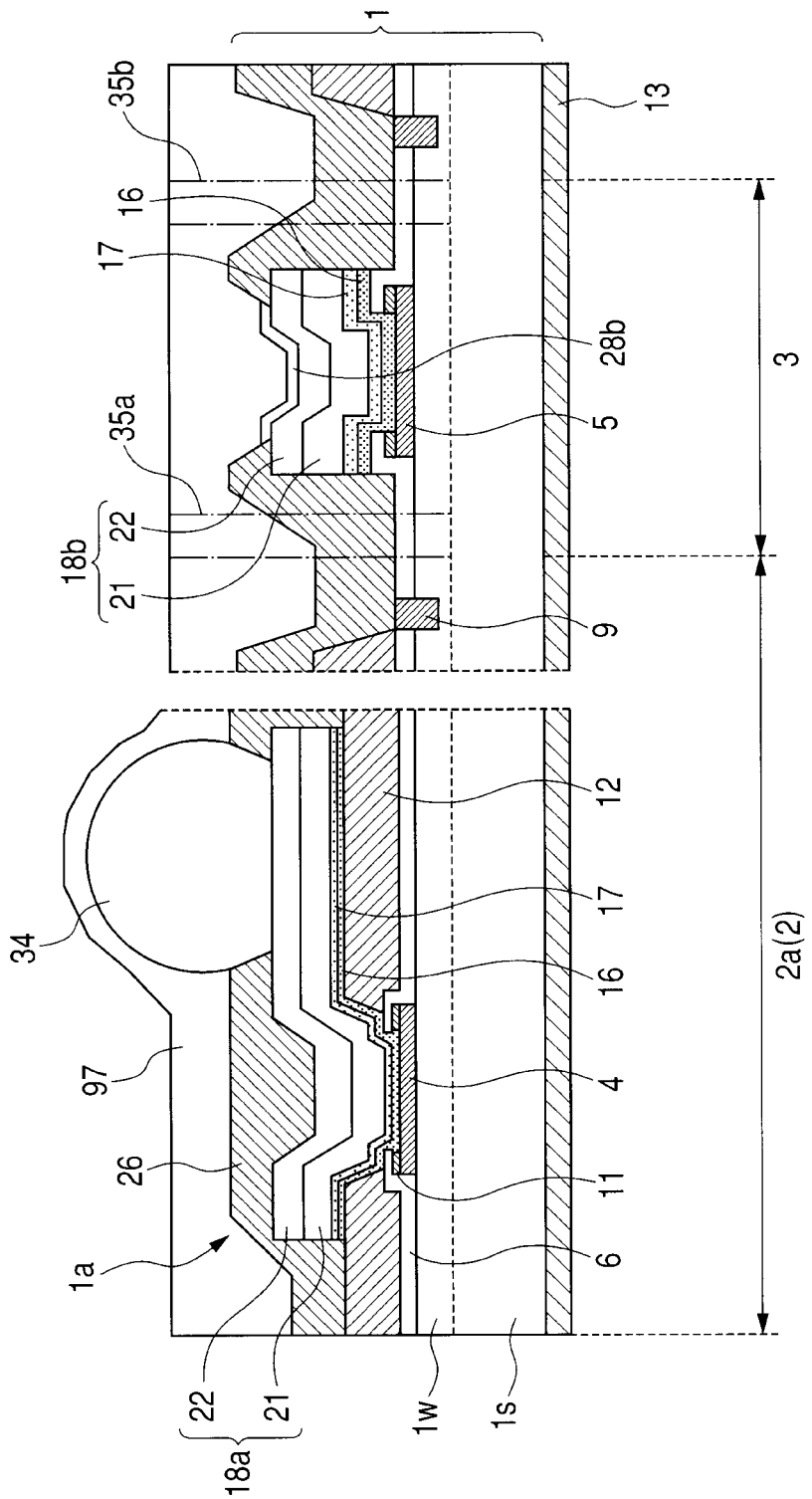
FIG. 27 is a detailed cross sectional flowchart (completion of water-soluble protective film coating) of the steps of FIG. 14, and FIGS. 17 to 19 (previously, the single step full cut system has already been described, and hence, herein, step cut dicing is described as a variation)

First, the laser grooving device 86 will be described. As shown in FIG. 23, a to-be-processed wafer 1 is stored in a wafer load and unload part 87 with the back surface 1b fixed to the dicing frame 10 via a dicing tape 13. Therefrom, the to-be-processed wafer 1 is set in a spin table 89 by a handling robot 88. Thus, the surface 1a of the to-be-processed wafer 1 is almost entirely coated with a water-soluble polymer film 97 (FIG. 27). Subsequently, the to-be-processed wafer 1 is transferred to a prealignment stage 90 by the handling robot 88. Therein, prealignment is carried out, and further, laser grooving is carried out with the to-be-processed wafer 1 adsorbed and fixed to an adsorption table 67 of a laser exposure part. Scanning of a laser beam is generally carried out by horizontally moving the XY table on the adsorption table 67 side (wafer side). However, a laser beam may be scanned by horizontally moving the XY table on the laser beam head 91 side, or using a mirror system (effective for high-speed scanning). Alternatively, both may be moved (e.g., movement is carried out with one direction being toward the wafer and the direction perpendicular thereto being toward the beam).

Upon completion of laser grooving, the to-be-processed wafer 1 is set to the spin table 89 again by the handling robot 88. Thus, removal, washing, and drying of the water-soluble polymer film are carried out. Then, the to-be-processed wafer 1 is returned to the wafer load and unload part 87 by the handling robot 88. Then, the to-be-processed wafer 1 is transferred to the dicing device 82 while being fixed to the dicing frame 10.

As shown in FIGS. 24 and 25, the dicing device 82 has the adsorption table 67 (wafer stage), and vacuum adsorbs thereover the wafer 1 adhered and fixed at the back surface 1*b* thereof to the ring frame 10 with the device surface 1*a* of the wafer 1 facing upward via a dicing tape 13. In that state, to a tip end 78 of a spindle 77 held by a spindle holding part 76, a dicing blade 30 is attached via a blade holding part 66. Thus, the dicing blade 30 is allowed to rotate at a high speed, thereby to carry out cutting (groove digging or cutting). At this step, in general, the stage 67 side moves in the horizontal direction to carry out cutting. As a result, a dicing groove 29 (37) is formed. Fur cutting, pure water and a cooling liquid are supplied from a cooling water supply arm-like nozzle 79, a pure water spray 80, a pure water shower 81, and the like for cooling and washing.

5. Further detailed explanation of the dicing step of the method for manufacturing a semiconductor integrated circuit device of one embodiment of the present invention (mainly FIGS. 26 to 34)

In the explanation of the dicing step of Section 2, the example in which the organic type passivation film is included over the scribe region 3 was specifically described from the viewpoint of improvement of the testability of the device having a rewiring structure. However, below, not limited to such an example, a description will be given to a laser grooving technology (laser exposure processing) using five or more laser exposure passes from the viewpoint of the process adapted to a device having the rewiring structure over the scribe region 3, or a device sensitive to damages to the periphery of the chip due to laser grooving.

Figure 26:
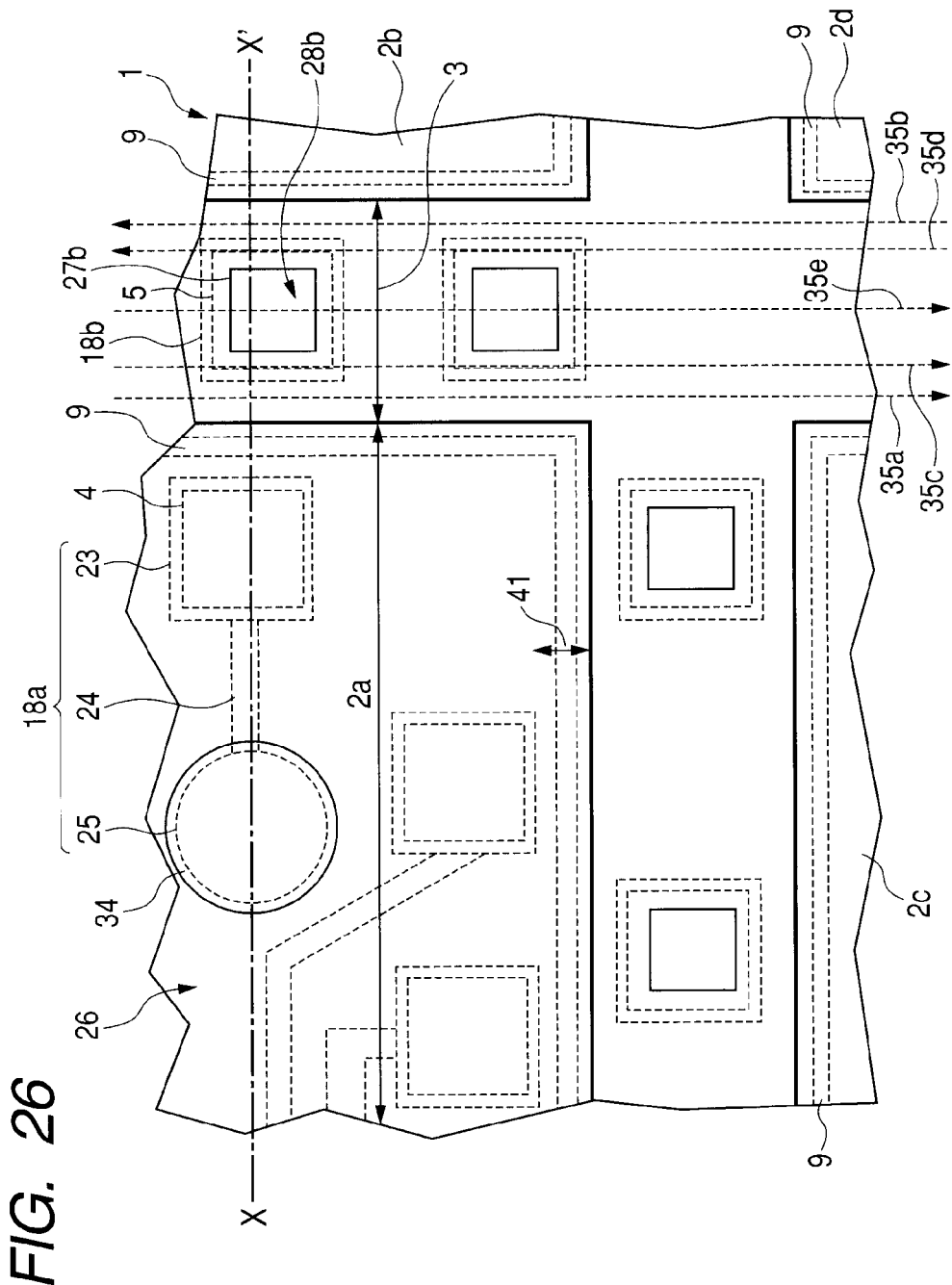
FIG. 26 is a wafer top view for illustrating the arrangement of respective laser exposure scan passes in the state of FIG. 16.
Figure 28:
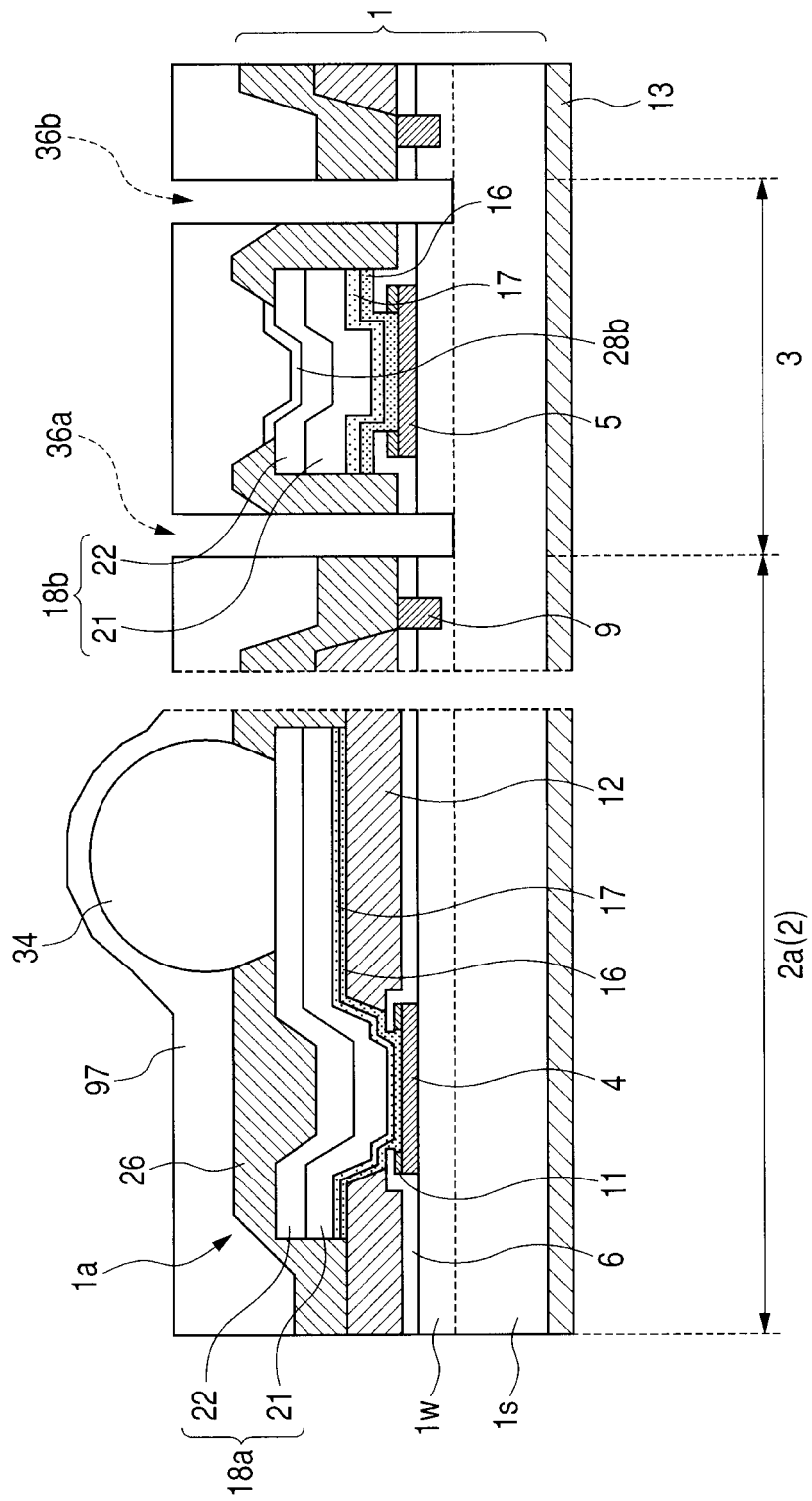
FIG. 28 is a detailed cross sectional flowchart of the steps of FIG. 14, and FIGS. 17 to 19 (completion of peripheral exposure passes)
Figure 29:
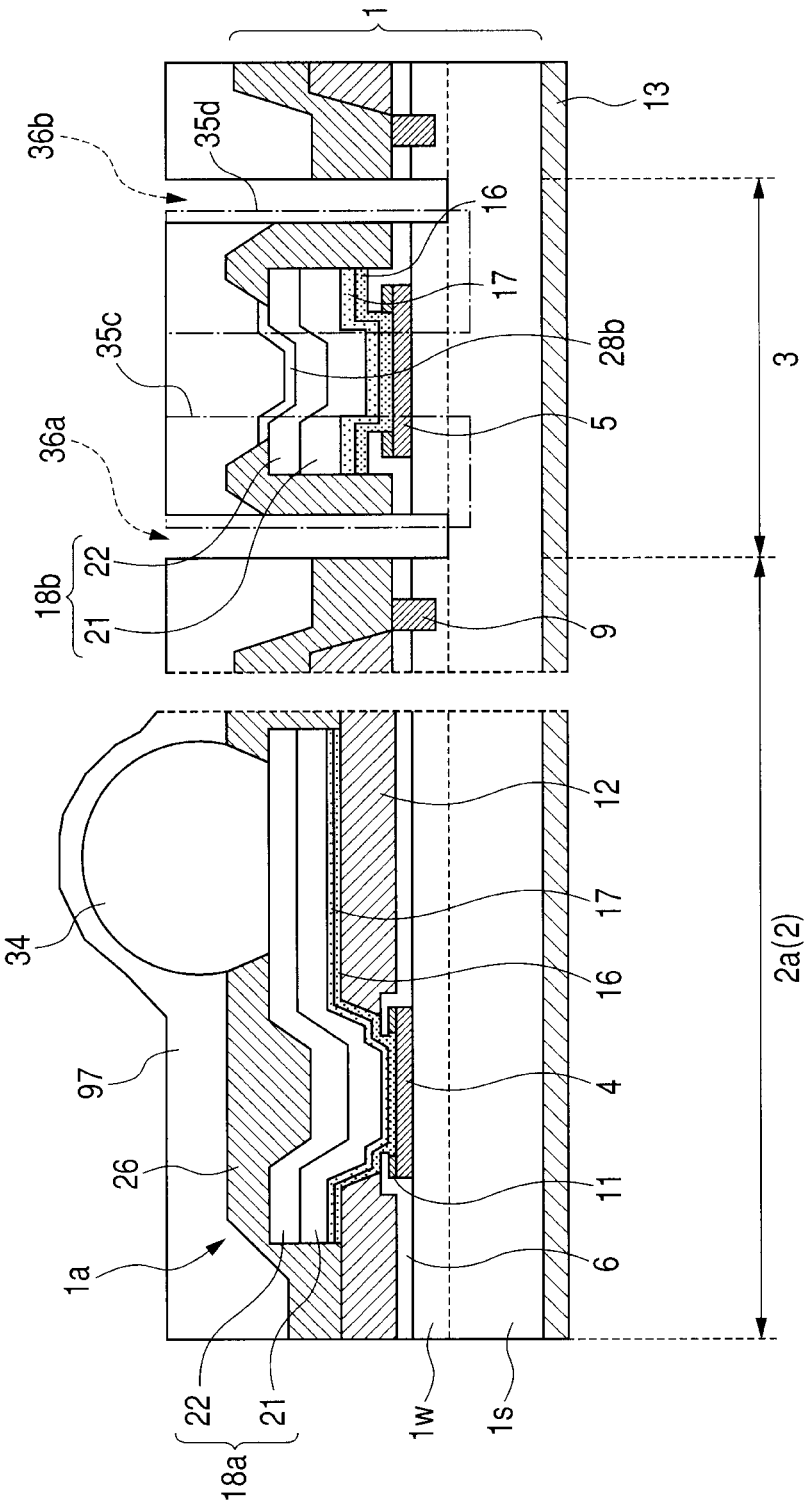
FIG. 29 is a detailed cross sectional flowchart of the steps of FIG. 14, and FIGS. 17 to 19 (before intermediate exposure passes)
Figure 30:
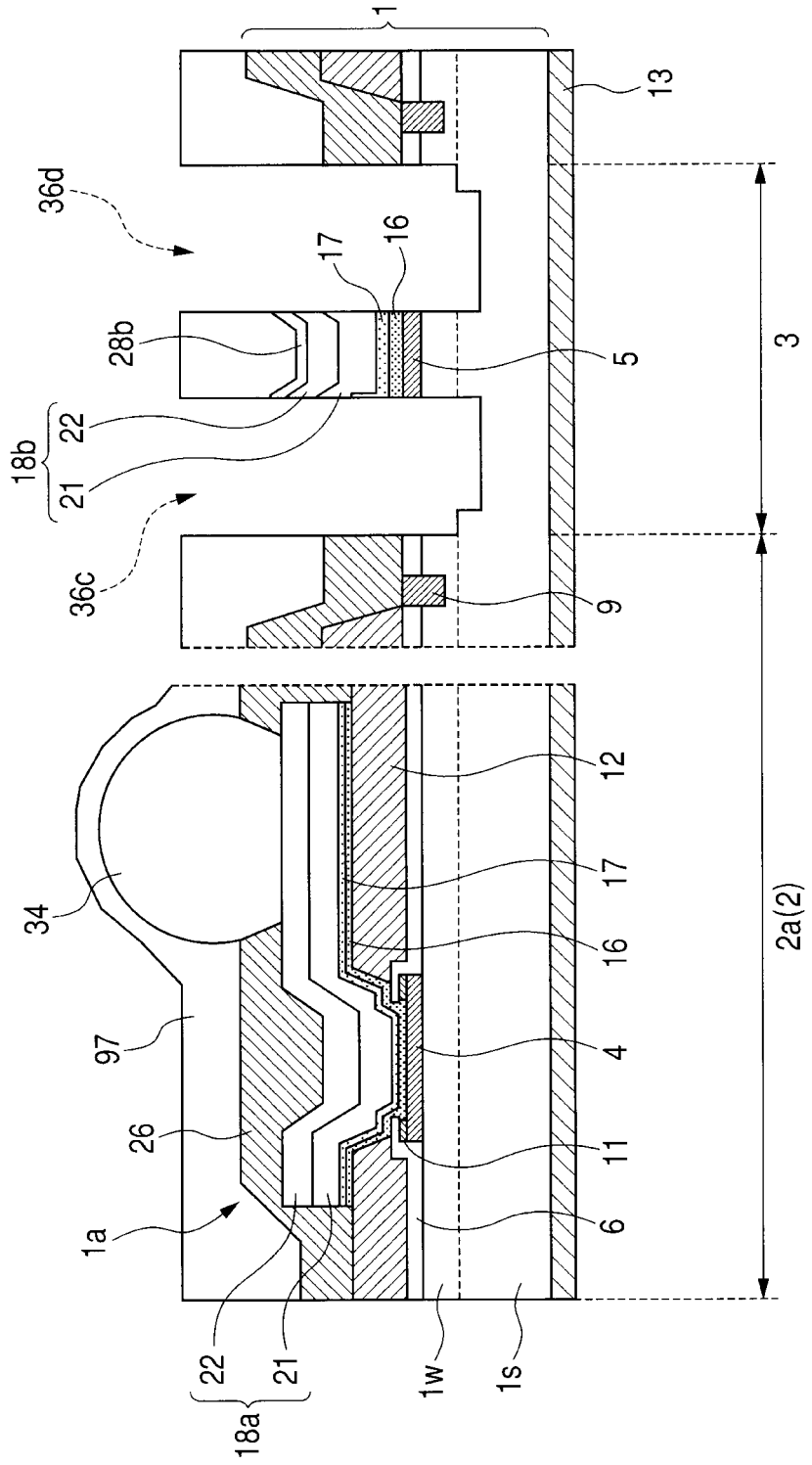
FIG. 30 is a detailed cross sectional flowchart of the steps of FIG. 14, and FIGS. 17 to 19 (completion of intermediate exposure passes)
Figure 31:
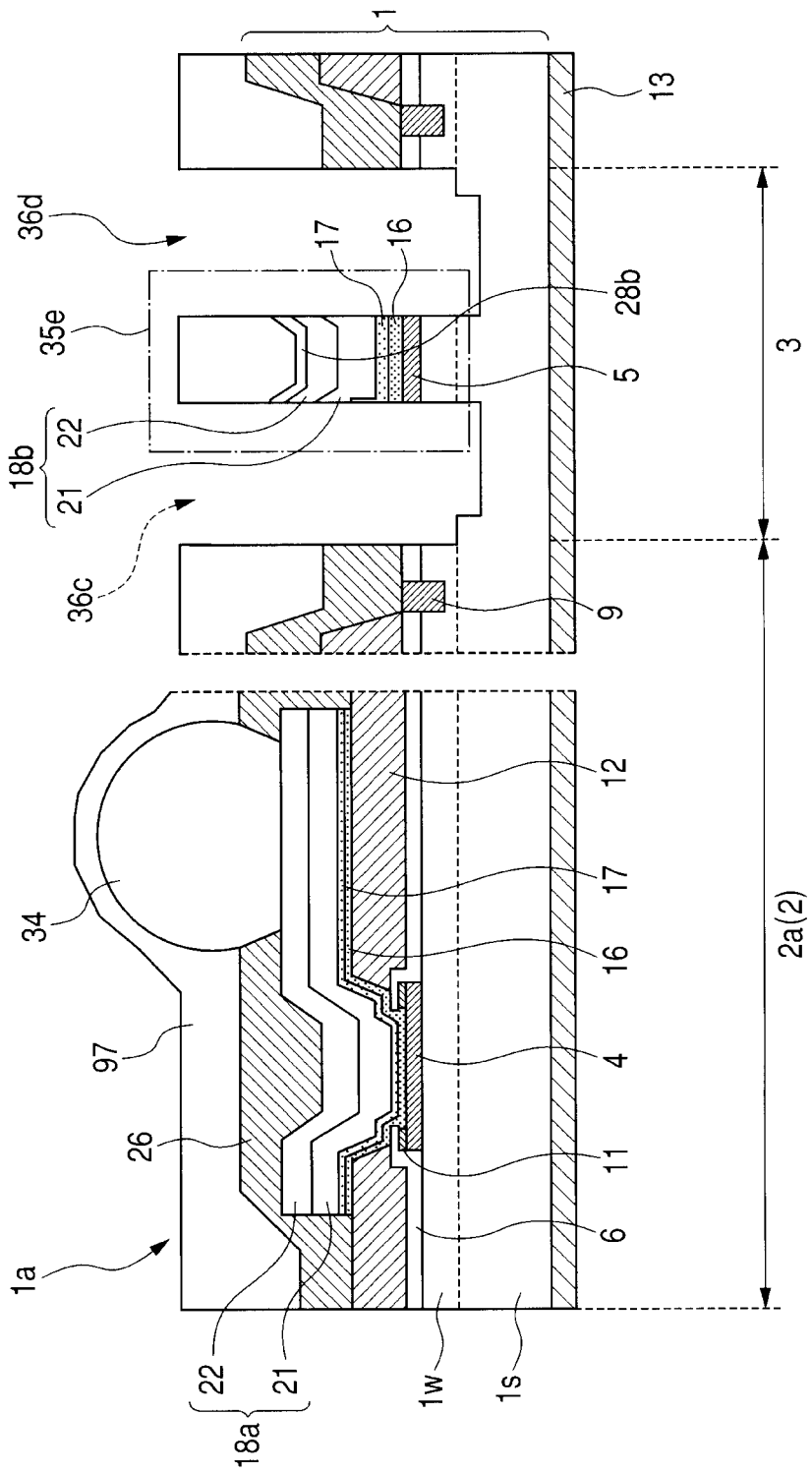
FIG. 31 is a detailed cross sectional flowchart of the steps of FIG. 14, and FIGS. 17 to 19 (before central exposure pass)
Figure 32:
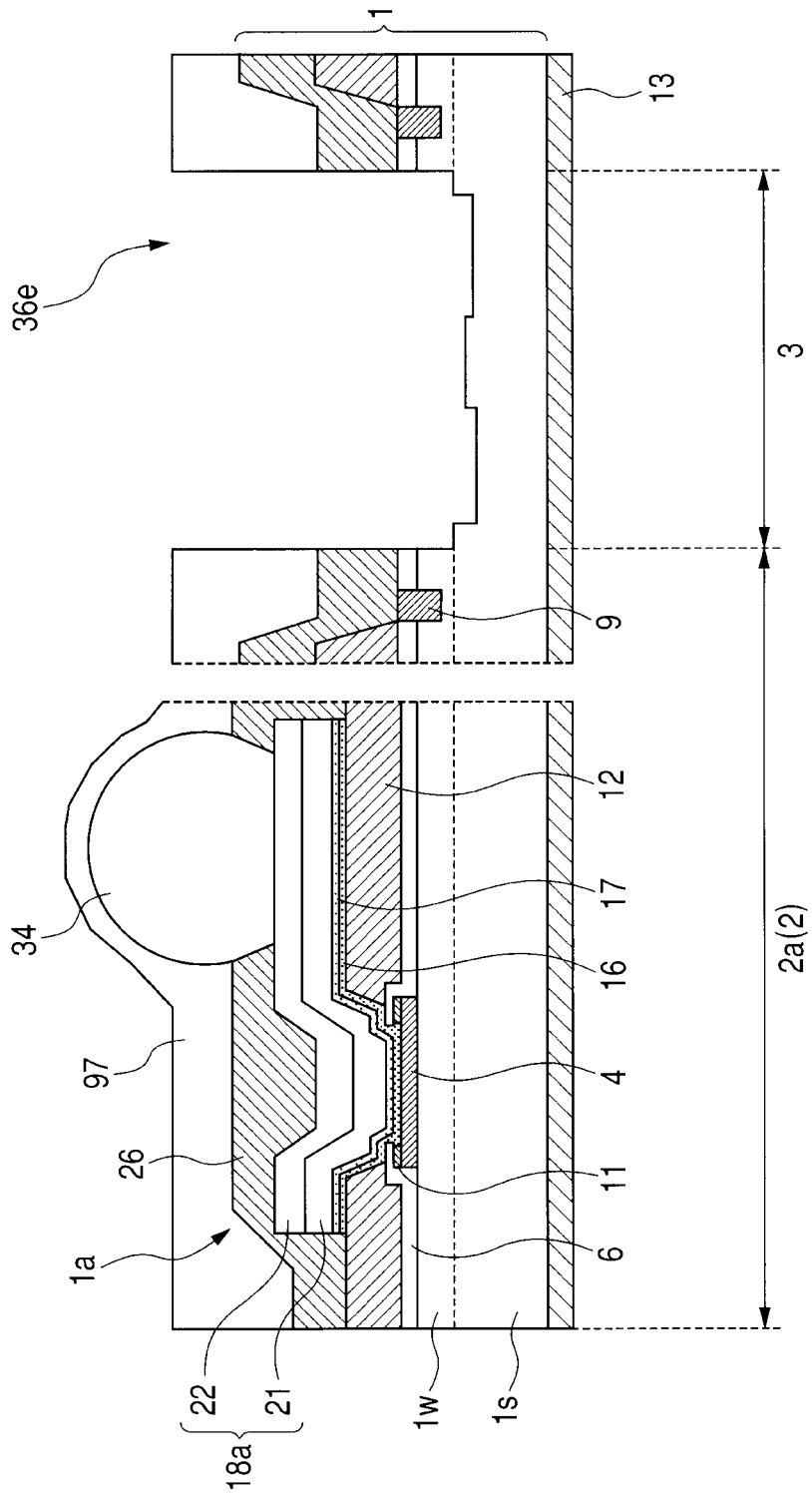
FIG. 32 is a detailed cross sectional flowchart of the steps of FIG. 14, and FIGS. 17 to 19 (completion of central exposure pass)
Figure 33:
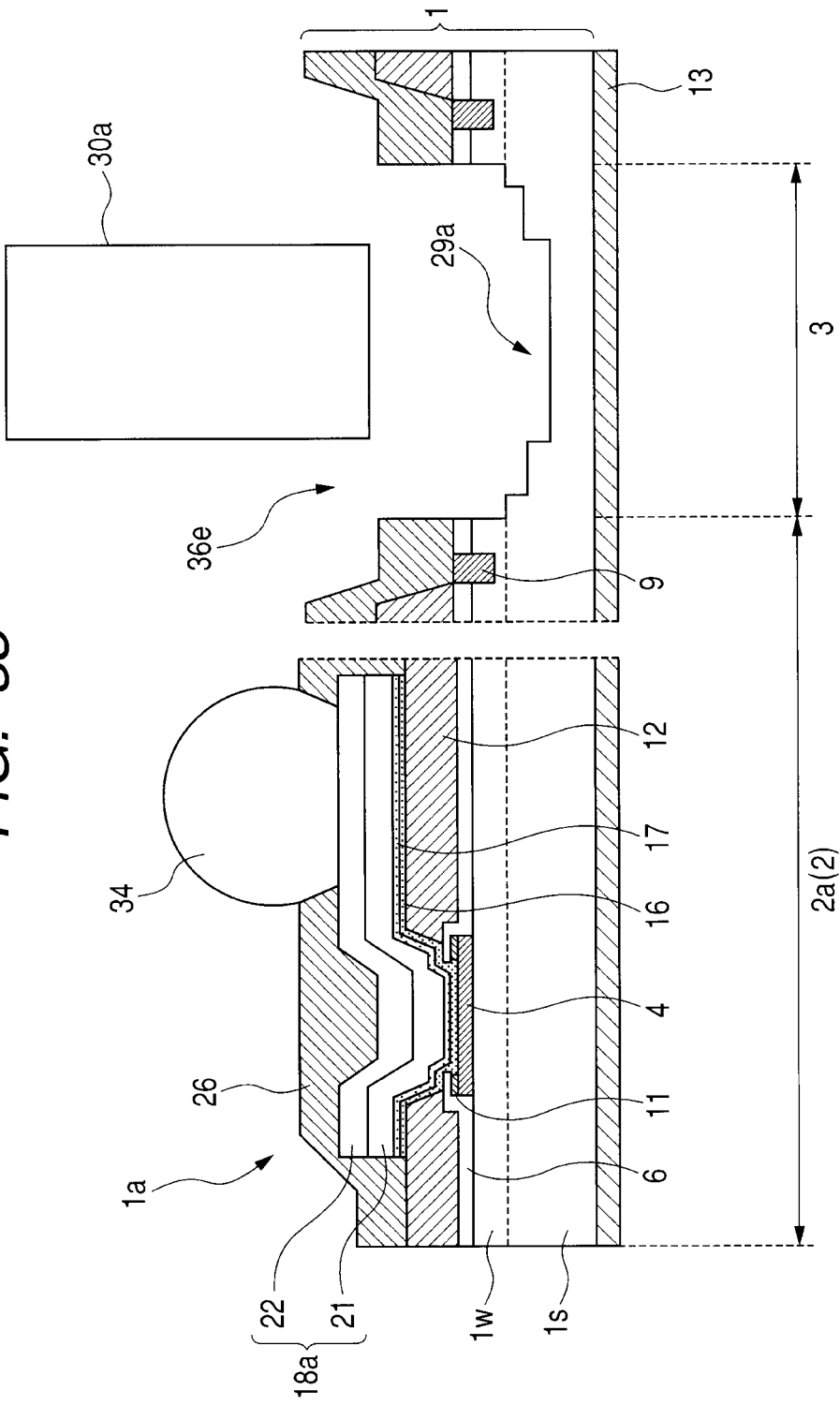
FIG. 33 is a detailed cross sectional flowchart of the steps of FIG. 14, and FIGS. 17 to 19 (water-soluble protective film removal and step cut first step completion)
Figure 34:
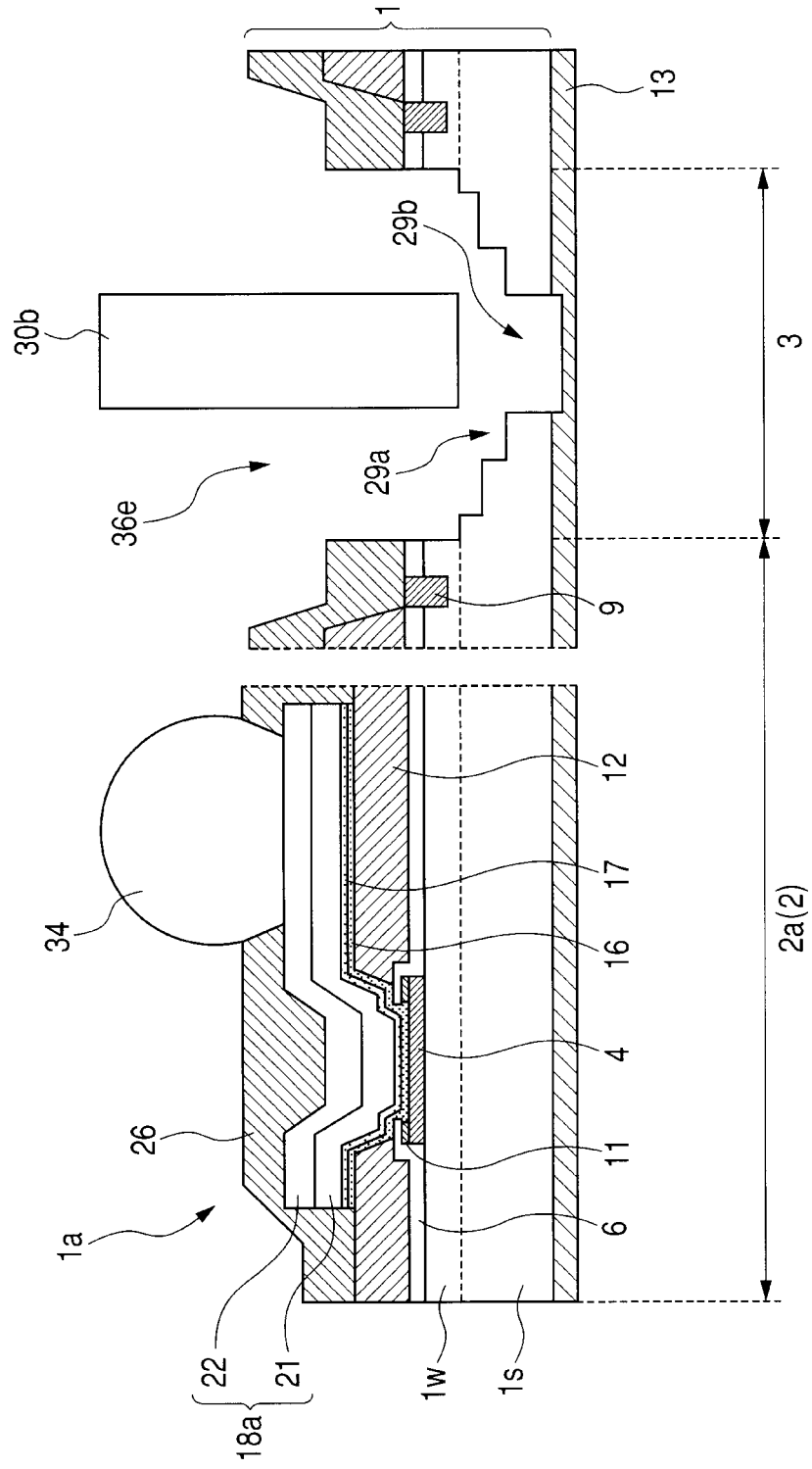
FIG. 34 is a detailed cross sectional flowchart of the steps of FIG. 14, and FIGS. 17 to 19 (water-soluble protective film removal and step cut second full cut step completion)

FIG. 26 is a wafer top view for illustrating the arrangement of respective laser exposure scan passes in the state of FIG. 16. FIG. 27 is a detailed cross sectional flowchart (completion of water-soluble protective film coating) of the steps of from FIGS. 17 to 19 (previously, the single step full cut system has already been described, and hence, herein, step cut dicing is described as a variation). FIG. 28 is a detailed cross sectional flowchart of the steps of FIG. 14, and FIGS. 17 to 19 (completion of peripheral exposure pass). FIG. 29 is a detailed cross sectional flowchart of the steps of FIG. 14, and FIGS. 17 to 19 (before intermediate exposure passes). FIG. 30 is a detailed cross sectional flowchart of the steps of FIG. 14, and FIGS. 17 to 19 (completion of intermediate exposure pass). FIG. 31 is a detailed cross sectional flowchart of the steps of FIG. 14, and FIGS. 17 to 19 (before central exposure pass). FIG. 32 is a detailed cross sectional flowchart of the steps of FIG. 14, and FIGS. 17 to 19 (completion of central exposure pass). FIG. 33 is a detailed cross sectional flowchart of the steps of FIG. 14, and FIGS. 17 to 19 (water-soluble protective film removal and step cut first step completion). FIG. 34 is a detailed cross sectional flowchart of the steps of FIG. 14, and FIGS. 17 to 19 (water-soluble protective film removal and step cut second full cut step completion). FIG. 35 is a schematic wafer cross sectional view of the scribe region for conceptually illustrating the dicing step in the method for manufacturing a semiconductor integrated circuit device of one embodiment of the present invention. By reference to these, a further detailed description will be given to the dicing step in the method for manufacturing a semiconductor integrated circuit device of one embodiment of the present invention.

As shown in FIG. 26, a laser grooving process as a part of the laser dicing process (herein, a description will be given by taking a process including five laser beam exposure passes of the laser grooving process including five or more laser beam exposure passes as an example) is started in the state of FIG. 16. As shown in FIG. 27, with the back surface 1*b* fixed to the dicing frame 10 via the dicing tape 13, the to-be-processed wafer 1 is almost entirely coated on the surface 1*a* with the water-soluble polymer film 97 (water-soluble protective film) . This is in order to prevent the following: the wafer forming members vaporized, sublimed, molten, and the like due to laser exposure scatter, and are deposited as debris directly on the device. The thickness of the water-soluble polymer film 97 is most preferably, for example, about 2 micrometers. Whereas, the main composition of the coating solution for the water-soluble polymer film is preferably, for example, about 10 wt % propylene glycol monomethyl ether, about 5 wt % polyvinyl alcohol, and about 85 wt % water.

In this state, as shown in FIG. 26, out of the laser beam exposures, a pair of peripheral exposure passes 35*a* and 35*b* are sequentially carried out. Namely, first, scanning of the peripheral exposure pass 35*a* is carried out. The peripheral exposure pass 35*a* cuts the wafer 1 longitudinally. Subsequently, scanning of the peripheral exposure pass 35*b* is carried out on the same scribe region 3 (the scan direction is, for example, opposite from the previous direction). When the peripheral exposure pass 35*b* cuts the wafer 1 longitudinally in the opposite direction, as shown in FIG. 28, a groove 36*a* by the peripheral exposure pass 35*a* and a groove 36*b* by the peripheral exposure pass 35*b* are formed. Examples of the exposure conditions are as follows. The type of laser: Nd:YAG Q switching pulse operating solid-state laser, the laser beam central wavelength: 355 nm (third harmonic, ultraviolet region), the mean laser power: about 1 W, the Q switching frequency (pulse repetition frequency): about 200 kHz, the pulse length (pulse duration): about 100 to 300 nm, the defocus amount: about 0 micrometer, and the scan rate: 600 mm/sec.

Then, as shown in FIGS. 29 and 26, on the slightly inner side from a pair of the peripheral exposure passes 35*a* and 35*b*, a pair of the intermediate exposure passes 35 *c* and 35*d* are sequentially carried out. Namely, first, scanning of the intermediate exposure pass 35*c* is carried out. The intermediate exposure pass 35*c* cuts the wafer 1 longitudinally. Subsequently, scanning of the intermediate exposure pass 35*d* is carried out (the scan direction is, for example, opposite from the previous direction) on the same scribe region 3. When the intermediate exposure pass 35*d* longitudinally cuts the wafer 1 in the opposite direction, as shown in FIG. 30, a groove 36*c* expanded by the intermediate exposure pass 35*c* and a groove 36*d* expanded by the intermediate exposure pass 35*d* are formed. The grooves 35*c* and 36*d* are deeper than the grooves 36*a* and 36*b* by the peripheral exposure passes 35*a* and 35*b*, and reach the inside of the semiconductor substrate is across the interface between the multilayer wiring layer 1*w* and the semiconductor substrate is under the pad. Examples of the exposure conditions are as follows. The type of laser: Nd:YAG Q switching pulse operating solid-state laser, the laser beam central wavelength: 355 nm (third harmonic, ultraviolet region), the mean laser power: about 3 W, the Q switching frequency (pulse repetition frequency): about 80 kHz, the pulse length (pulse duration): about 100 to 300 nm, the defocus amount: about +100 micrometers (the focal plane is shifted upward), and the scan rate: 600 mm/sec.

Then, as shown in FIGS. 31 and 26, at the central part of the same scribe region 3, scanning of the central exposure pass 35e is carried out (the scan direction is, for example, opposite from the previous intermediate exposure pass 35d). When the central exposure pass 35e longitudinally cuts the wafer 1, as shown in FIG. 32, a groove 36e expanded by the central exposure pass 35e is formed. The groove 36e is deeper than the grooves 36a and 36b, and shallower than the grooves 35c and 36d. The groove 36e may be made deeper. However, the groove 36e is made deeper than necessary, resulting in an increase in amount of debris. On the other hand, when the groove 36e has such a depth as to largely leave the multilayer wiring layer 1w, the residual portion of the wiring metal member causes a load on the rotary blade. This results in deterioration of the blade dicing characteristics. Examples of the exposure conditions are as follows. The type of laser: Nd:YAG Q switching pulse operating solid-state laser, the laser beam central wavelength: 355 nm (third harmonic, ultraviolet region), the mean laser power: about 4 W, the Q switching frequency (pulse repetition frequency): about 50 kHz, the pulse length (pulse duration): about 100 to 300 nm, the defocus amount: about +100 micrometer (the focal plane is shifted upward), and the scan rate: 600 mm/sec.

Then, as shown in FIG. 33, the water-soluble polymer film 97 over the surface 1a of the wafer 1 is removed with debris by water washing. Subsequently, by a cutting processing with a dicing blade 30a (rotary blade) with a large blade thickness, a dicing groove 29a by the dicing blade with a large blade thickness is formed at almost the central part of the groove 36e. The dicing groove 29a is provided in order to reduce the load on the rotary blade in the formation of the following separation groove 29b (FIG. 34).

Then, as shown in FIG. 34, by a cutting processing with a dicing blade 30b (rotary blade) with a small blade thickness, a dicing groove 29b (a dicing groove for chip separation) by the dicing blade with a small blade thickness is formed at almost the central part of the dicing groove 29a. The groove cuts into the inside of the dicing tape 13. As a result, herein, the wafer 1 has been separated into individual chips 2.

Incidentally, herein, a description was given to the dicing process including laser grooving and blade dicing in combination. However, for the latter blade dicing, a step cut system (whereby the wafer is separated into chips using two blades having different thicknesses after laser grooving) was described. However, there may be applied thereto a single blade system (whereby the wafer is separated into chips by a single blade after laser grooving) as described in Section 2.

6. Additive explanation on the dicing step in the method for manufacturing a semiconductor integrated circuit device of one embodiment of the present invention Herein, a further detailed description will be given to the dicing step described in Section 5 and the like.

FIG. 35 is a schematic wafer cross sectional view of the scribe region for conceptually illustrating the dicing step in the method for manufacturing a semiconductor integrated circuit device of one embodiment of the present invention. FIG. 36 is a view of FIG. 35 except for the dicing portion by the rotary blade. By reference to these views, there will be given an additive description on the dicing step in the method for manufacturing a semiconductor integrated circuit device of one embodiment of the present invention.

As shown in FIG. 35, the multilayer wiring layer 1w (generally, the thickness of this portion is about 10 to 20 micrometers, but, herein a description will be given assuming that the thickness thereof is about 10 micrometers) under the pad of each chip region 2 over the wafer 1 which is an object to be processed includes mainly an undermost premetal region PM, a multilayer Low-k layer portion 1wl (this is the main part of the multilayer wiring layer 1w) thereover, and, further, an upper layer non-Low k layer portion 1wn thereover.

At the beginning of the grooving step, a pair of peripheral exposure passes 35a and 35b (the width W1 in the vicinity of the top surface of the wafer of the peripheral exposure pass is, for example, about 10 micrometers) are carried out for the following purpose. By using relatively narrow beams (e.g., the to-be-processed side surface is made in agreement with the focus plane of the beam), the surface is struck many times with a relatively weak pulse. As a result, while avoiding damages to the periphery, the end face of the chip is molten, thereby to establish a vitreous strong wall surface. This prevents propagation of cracks in the subsequent processings. As for the depth of the grooves 36a and 36b by the peripheral exposure passes, the processing is optimally stopped immediately before the grooves 36a and 36b reach the semiconductor substrate 1s (e.g., stopped upon roughly removing the premetal region PM). However, the grooves 36a and 36b may reach the semiconductor substrate 1s in terms of the error. However, when the grooves 36a and 36b cut into the inside of the semiconductor substrate is too deeply, debris increase. Incidentally, in consideration of the fact that peeling and cracks tend to occur mainly in the Low-k layer portion 1wl, the grooves 36a and 36b by the peripheral passes preferably at least reach the premetal region PM with reliability.

The intermediate exposure passes 35c and 35d (the width W2 in the vicinity of the wafer top surface of the intermediate exposure passes is, for example, about 30 micrometers), which are the next steps of the grooving step, are carried out for the following purpose. By using a relatively wide beam (e.g., the focus plane of the beam is shifted to a position about 100 micrometers above the to-be-processed surface, i.e., is defocused), the surface is struck relatively small number of times with a relatively strong pulse. As a result, the major portion of the surface layer metal structure (the uppermost layer pad electrodes 5 of the common wiring, and the test rewiring pattern) over the multilayer wiring layer 1w, and the inner metal structures (the target, the test pattern, the test pads, and other wiring for test, and the like) in the multilayer wiring layer 1w are removed with the surrounding insulating materials (of inorganic type and organic type). Without this step, there arises a necessity of largely increasing the exposure energy of the central exposure pass 35e. This however results in an increase in damages, which leads to a high possibility that propagation of cracks or damages becomes unable to be prevented at the wall surface established by the peripheral exposure passes 35a and 35b.

The central exposure pass 35e (the width W2 in the vicinity of the wafer top surface of the central exposure pass is, for example, about 30 micrometers) which is the next step of the grooving step is carried out for the following purpose. The metal structures remaining at the central part are removed with surrounding insulating materials (of inorganic type and organic type). This step can be carried out with a relatively weaker exposure energy as compared with the case without this step because it is preceded by the intermediate exposure passes 35c and 35d. In this step, it is essential only that the metal structures (particularly the surface layer metal structure) remaining at the central part are mainly removed. Therefore, the depth may be smaller than that of the intermediate exposure passes 35c and 35d. However, the amount of the structures to be removed by one pass is large. Accordingly, the mean laser power thereof is generally largest of the five passes. Therefore, the conditions for exposure are as follows. By using a relatively wide beam (e.g., the focus plane of the beam is shifted to a position about 100 micrometers above the to-be-processed side surface, i.e., is defocused), the surface is struck relatively small number of times with a relatively strong pulse. Namely, a stronger mean laser power is preferably achieved with fewer and stronger pulses than with the intermediate exposure passes 35c and 35d.

Incidentally, when the width of the surface layer metal structure 18b (5) is about 65 micrometers, the shift distance LP between the center line CL of the scribe region and the peripheral exposure passes 35a and 35b is preferably, for example, about 35 micrometers. The shift distance LM between the center line CL of the scribe region and the intermediate exposure passes 35c and 35d is preferably, for example, about 25 micrometers.

Namely, the centers of the peripheral exposure passes 35a and 35b are preferably outward of respective ends of the surface layer metal structure 18b (5). More preferably, the width W1 of the peripheral exposure passes 35a and 35b extends to the outsides of the ends of the surface layer metal structure 18b (5). As a result, the grooves 36a and 36b can be formed while avoiding damages to the periphery.

The centers of the intermediate exposure passes 35c and 35d are preferably situated over the surface layer metal structure 18b (5). More preferably, the width W2 of the intermediate exposure passes 35c and 35d is preferably prevented from extending beyond the outer ends of the W1 of the peripheral exposure passes 35a and 35b. As a result, the surface layer metal structure 18b (5) can be removed while avoiding damages to the periphery, and the grooves 35c and 36d can be formed. The width W3 of the central exposure pass 35e is preferably set so as to overlap the width W2 of the peripheral exposure passes 35c and 35d. As a result, the surface layer metal structure 18b (5) can be removed while avoiding damages to the periphery, and the groove 35e can be formed.

Incidentally, the shift distance LP is the distance between the center line CL of the scribe region and each center of the peripheral exposure passes 35a and 35b. The shift distance LM is the distance between the centerline CL of the scribe region and each center of the intermediate exposure passes 35c and 35d.

Then, the latter dicing by a rotary blade will be described. The objects of the cutting processing by the dicing blade 30a with a large blade thickness (e.g., the blade thickness B1 is about 60 micrometers) of the first step are mainly as follows: the configuration rich in irregular unevenness characteristic of laser grooving is made flat, so that the blade is prevented from moving during cutting by the dicing blade 30b with a small blade thickness; and other objects. The blade thickness B1 must be, of course, narrower than the width W4 of the laser grooving groove (e.g., when the width of the scribe region 3 is about 150 micrometers, and the thickness TS of the semiconductor wafer is about 600 micrometers, the width W4 of the laser grooving groove is generally about 80 to 90 micrometers). Thus, the dicing blade 30a preferably cuts the vicinity of the center of the laser grooving groove 36e so as not to come in contact with the sidewall of the laser grooving groove 36e.

Therefore, the dicing processing by the dicing blade 30b with a small blade thickness (e.g., the blade thickness B2 is about 40 micrometers) of the second step is carried out on the vicinity of the central part of the dicing groove 29a (e.g., the depth BD is about 80 micrometers) smoothed by the dicing blade with a large blade thickness.

7. Summary

The invention made by the present inventors was specifically described by way of embodiments, which should not be construed as limiting the present invention. It is naturally understood that various changes may be made within a scope not departing from the gist thereof.

For example, in the embodiments, a package structure including a single chip flip-chip coupled to the wiring substrate was shown. However, the present invention is not limited thereto. It is naturally understood that the present invention is also applicable to a package structure in which a chip is flip-chip coupled together with other chips or devices to the wiring substrate and further to over other chips (the other chips and further other chips may be not flip-chip coupled thereto), and the like.

Further, in the embodiments, a specific description was given to the device in which almost all the layers of the wiring layers are damascene wirings. However, the present invention is not limited thereto. It is naturally understood that the present invention is also similarly applicable to a device in which almost all the layers are aluminum type common wiring and a device having a wiring structure using a copper type or silver type damascene wiring and an aluminum type common wiring in combination.

Whereas, in the embodiments, the example using YAG as a laser was specifically described. However, the present invention is not limited thereto. It is naturally understood that YVO4, a glass laser therefor, or the like may be used. Further, the laser wavelength is also not limited to 355 nm. It is naturally understood that other wavelengths belonging to an ultraviolet region may be used.

Incidentally, in the embodiments, a specific description was given to the wafer dicing method including laser grooving and blade dicing, in combination. However, the present invention is not limited thereto. It is naturally understood that the method includes the first half step of groove formation using five or more laser exposure passes, and the latter half step of applying laser dicing (based on ablation or stylus, or modified layer formation by two-photon absorption) for cutting. Further, the latter half step may be a process of separation into chips by performing back grinding.

What is claimed is:

1. A method for manufacturing a semiconductor integrated circuit device, comprising the steps of:
   (a) forming an on-chip rewiring pattern in each chip region over a device surface of a semiconductor wafer having a plurality of chip regions, and a scribe region therebetween, and forming a test rewiring pattern electrically coupled to an aluminum type pad electrode in the scribe region;
   (b) after the step (a), forming an organic type insulation film almost entirely over the device surface including the surface of the on-chip rewiring pattern;
   (c) forming a bump forming opening in the organic type insulation film over the on-chip rewiring pattern;
   (d) forming a bump electrode over the on-chip rewiring pattern at the bump forming opening;
   (e) after the step (d), carrying out a laser processing on the scribe region, and thereby removing the test rewiring pattern and the aluminum type pad electrode; and
   (f) carrying out a dicing processing using a rotary blade on the region subjected to the laser processing, and thereby separating the semiconductor wafer into respective chip regions,
   wherein upon completion of the step (d), the organic type insulation film forms an integral film pattern covering almost the entire region of the chip regions except for the bump forming opening, and almost the entire region of the scribe region.

2. A method for manufacturing a semiconductor integrated circuit device, comprising the steps of:

(a) forming an on-chip rewiring pattern in each chip region over a device surface of a semiconductor wafer having a plurality of chip regions, and a scribe region therebetween, and forming a test rewiring pattern electrically coupled to an aluminum type pad electrode in the scribe region;

(b) after the step (a), forming an organic type insulation film almost entirely over the device surface including the surface of the on-chip rewiring pattern;

(c) forming a bump forming opening in the organic type insulation film over the on-chip rewiring pattern;

(d) forming a bump electrode over the on-chip rewiring pattern at the bump forming opening;

(e) after the step (d), carrying out a laser processing on the scribe region, and thereby removing the organic type insulation film; and (f) carrying out a dicing processing using a rotary blade on the region subjected to the laser processing, and thereby separating the semiconductor wafer into respective chip regions, wherein upon completion of the step (d), the organic type insulation film forms an integral film pattern covering almost the entire region of the chip regions except for the bump forming opening, and almost the entire region of the scribe region.

3. The method for manufacturing a semiconductor integrated circuit device according to claim 2, wherein in the step (e), the laser processing is carried out, and thereby, further, the test rewiring pattern and the aluminum type pad electrode are removed.

4. A method for manufacturing a semiconductor integrated circuit device, comprising the steps of:

(a) forming an on-chip rewiring pattern in each chip region over a device surface of a semiconductor wafer having a plurality of chip regions, and a scribe region therebetween;

(b) after the step (a), forming an organic type insulation film almost entirely over the device surface including the surface of the on-chip rewiring pattern;

(c) forming a bump forming opening in the organic type insulation film over the on-chip rewiring pattern;

(d) forming a bump electrode over the on-chip rewiring pattern at the bump forming opening;

(e) after the step (d), carrying out a laser grooving processing on the scribe region, and thereby forming a groove; and (f) carrying out a dicing processing on the groove, and thereby separating the semiconductor wafer into respective chip regions, wherein upon completion of the step (d), the organic type insulation film forms an integral film pattern covering almost the entire region of the chip regions except for the bump forming opening, and almost the entire region of the scribe region.

5. The method for manufacturing a semiconductor integrated circuit device according to claim 4, wherein the dicing processing is carried out by a rotary blade with a smaller blade thickness than the width of the groove.

6. The method for manufacturing a semiconductor integrated circuit device according to claim 4, wherein the organic type insulation film is a polyimide type resin film.

7. The method for manufacturing a semiconductor integrated circuit device according to claim 4, wherein the bump electrode includes solder as a main constitutional element.

8. The method for manufacturing a semiconductor integrated circuit device according to claim 4, wherein the depth of the groove reaches a substrate region of the semiconductor wafer.

9. The method for manufacturing a semiconductor integrated circuit device according to claim 4, wherein in the step (a), a test rewiring pattern is formed in the scribe region at the same time.

* * * * *